United States Patent
Takaoka

(10) Patent No.: US 11,600,540 B2
(45) Date of Patent: Mar. 7, 2023

(54) SEMICONDUCTOR DEVICE

(71) Applicant: ROHM CO., LTD., Kyoto (JP)

(72) Inventor: Jun Takaoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 5 days.

(21) Appl. No.: 17/384,424

(22) Filed: Jul. 23, 2021

(65) Prior Publication Data
US 2021/0351091 A1    Nov. 11, 2021

Related U.S. Application Data

(63) Continuation of application No. 16/593,185, filed on Oct. 4, 2019, now Pat. No. 11,101,187.

(30) Foreign Application Priority Data

Oct. 5, 2018  (JP) ................. 2018-190197

(51) Int. Cl.
H01L 21/66       (2006.01)
H01L 29/08       (2006.01)
H01L 29/739      (2006.01)

(52) U.S. Cl.
CPC .......... H01L 22/32 (2013.01); H01L 29/0804 (2013.01); H01L 29/7397 (2013.01)

(58) Field of Classification Search
CPC ............. H01L 29/7397; H01L 29/1095; H01L 29/66348; H01L 27/0716; H01L 29/0619; H01L 29/7395
See application file for complete search history.

(56) References Cited

U.S. PATENT DOCUMENTS 5,729,032 A    3/1998 Tomomatsu et al.
11,101,187 B2 * 8/2021 Takaoka ............... H01L 29/0804
(Continued)

FOREIGN PATENT DOCUMENTS

JP      07240516 A    9/1995
JP    2009117786 A    5/2009
(Continued)

OTHER PUBLICATIONS

Japanese Patent Office; Notice of Reasons for Refusal for Japanese Patent Application 2018-190197 (related application); IWAMOTO, Tsutomu; dated Aug. 18, 2022; 10 Pages.

Primary Examiner — Changhyun Yi
(74) Attorney, Agent, or Firm — Gregory M. Howison

(57) ABSTRACT

A semiconductor device includes a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a well region of second-conductivity-type formed in the surface layer portion of the main surface at the boundary region, and a dummy trench gate structure formed in an electrically floating state in the main surface at the boundary region.

14 Claims, 15 Drawing Sheets

(56) References Cited

U.S. PATENT DOCUMENTS

| | | |
|---|---|---|
| 2009/0189219 A1 | 7/2009 | Shinbori et al. |
| 2019/0181252 A1 | 6/2019 | Shirakawa |
| 2019/0259748 A1 | 8/2019 | Naito |
| 2020/0335622 A1 | 10/2020 | Hiyoshi |

FOREIGN PATENT DOCUMENTS

| | | |
|---|---|---|
| JP | 2009182113 A | 8/2009 |
| JP | 2011171478 A | 9/2011 |
| JP | 2018113475 A | 7/2018 |
| WO | 2019106948 A1 | 6/2019 |

* cited by examiner

SEMICONDUCTOR DEVICE

CROSS REFERENCE TO RELATED APPLICATIONS

This application is a continuation of U.S. patent application Ser. No. 16/593,185, filed on Oct. 4, 2019, entitled SEMICONDUCTOR DEVICE, which claims the benefit of priority to Japanese Patent Application No. 2018-190197 filed on Oct. 5, 2018. The entire contents of the application are hereby incorporated herein by reference.

BACKGROUND OF THE INVENTION

1. Field of the Invention

The present invention relates to a semiconductor device that includes an active region and a current detection region.

2. Description of the Related Art

U.S. Pat. No. 5,729,032A discloses a semiconductor device that has a main IGBT cell (active region) in which an IGBT (Insulated Gate Bipolar Transistor) is formed and a sense IGBT cell (current detection region) in which an IGBT for current detection is formed.

JP2009-117786A discloses a semiconductor device that has a region (active region) in which a main IGBT is formed and a region (current detection region) in which a sense IGBT for current detection is formed.

JP2018-113475A discloses a semiconductor device that has a region (active region) in which a main IGBT of trench-gate type is formed and a region (current detection region) in which a sense IGBT of trench-gate type for current detection is formed.

SUMMARY OF THE INVENTION

A preferred embodiment of the present invention provides a semiconductor device that includes a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a well region of second-conductivity-type formed in the surface layer portion of the main surface at the boundary region; and a dummy trench gate structure formed in an electrically floating state in the main surface at the boundary region.

A preferred embodiment of the present invention provides a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a well region of second-conductivity-type formed in the surface layer portion of the main surface at the boundary region, and an insulator embedded in the surface layer portion of the main surface at the boundary region.

A preferred embodiment of the present invention provides a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a region of second-conductivity-type well formed in the surface layer portion of the main surface at the boundary region, and an insulation layer that selectively covers the active region, the current detection region, and the boundary region on the main surface and that has a thick film portion facing the well region at a portion covering the boundary region.

The aforementioned or other objects, features, and effects of the present invention will be clarified by the following description of preferred embodiments given below with reference to the accompanying drawings.

DETAILED DESCRIPTION OF THE PREFERRED EMBODIMENTS

Figure 1:
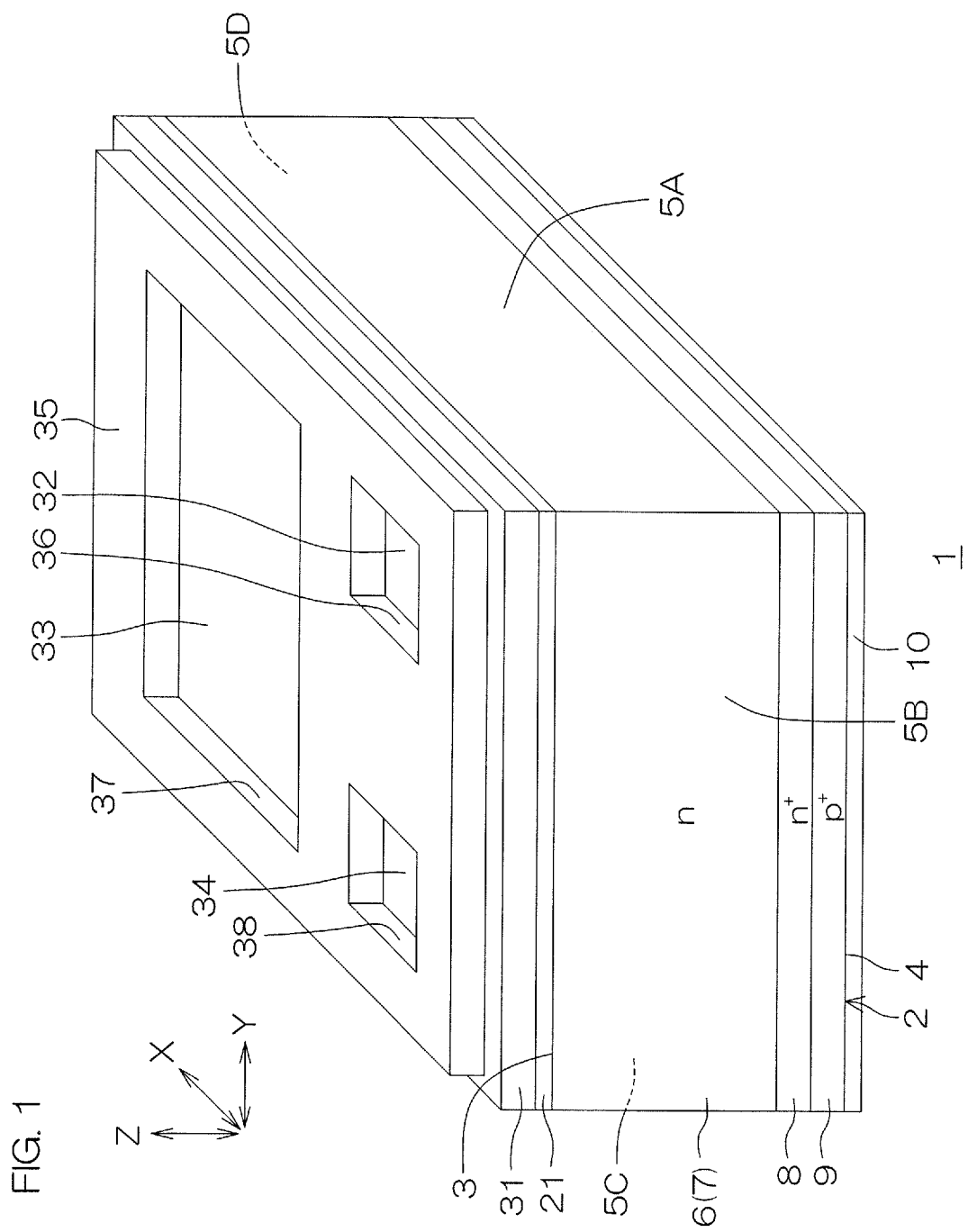
FIG. 1 is a perspective view of a semiconductor device according to a first preferred embodiment of the present invention, which is seen from one angle.

A preferred embodiment of the present invention provides a semiconductor device that is capable of restraining a decrease in withstand voltage that originates from a boundary region between an active region and a current detection region.

A preferred embodiment of the present invention provides a semiconductor device that includes a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a well region of second-conductivity-type formed in the surface layer portion of the main surface at the boundary region; and a dummy trench gate structure formed in an electrically floating state in the main surface at the boundary region.

A preferred embodiment of the present invention provides a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a well region of second-conductivity-type formed in the surface layer portion of the main surface at the boundary region, and an insulator embedded in the surface layer portion of the main surface at the boundary region.

A preferred embodiment of the present invention provides a semiconductor layer of first-conductivity-type that has a main surface and that includes an active region set at the main surface, a current detection region set at the main surface away from the active region, and a boundary region set in a region between the active region and the current detection region at the main surface, a first body region of second-conductivity-type formed in a surface layer portion of the main surface at the active region, a first trench gate structure formed in the main surface at the active region, a second body region of second-conductivity-type formed in the surface layer portion of the main surface at the current detection region, a second trench gate structure formed in the main surface at the current detection region, a region of second-conductivity-type well formed in the surface layer portion of the main surface at the boundary region, and an insulation layer that selectively covers the active region, the current detection region, and the boundary region on the main surface and that has a thick film portion facing the well region at a portion covering the boundary region.

According to these semiconductor devices, it is possible to restrain a decrease in withstand voltage that originates from the boundary region between the active region and the current detection region.

Hereinafter, preferred embodiments of the present invention will be described in detail with reference to the attached drawings.

Figure 2:
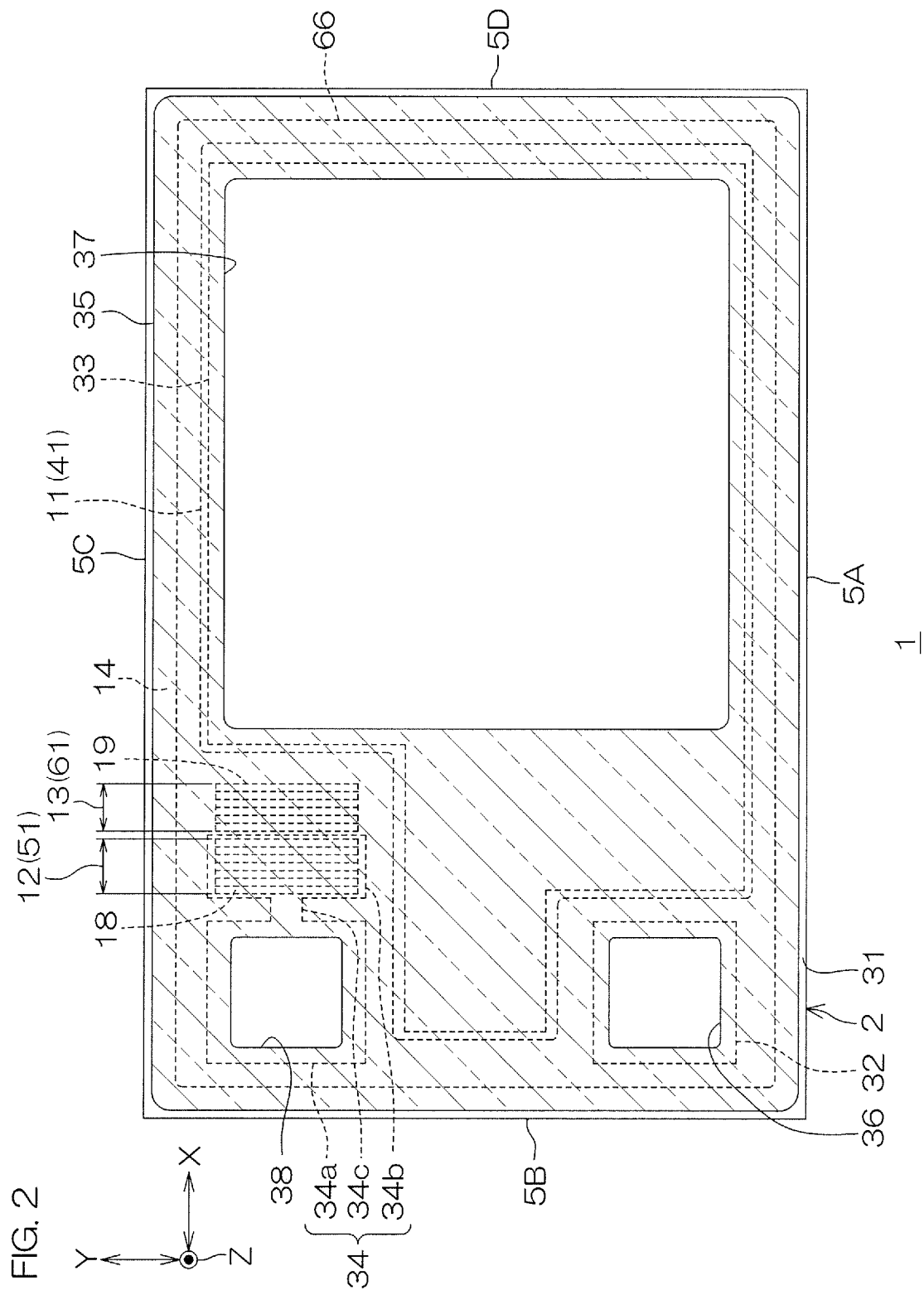
FIG. 2 is a plan view of the semiconductor device shown in FIG. 1.
Figure 3:
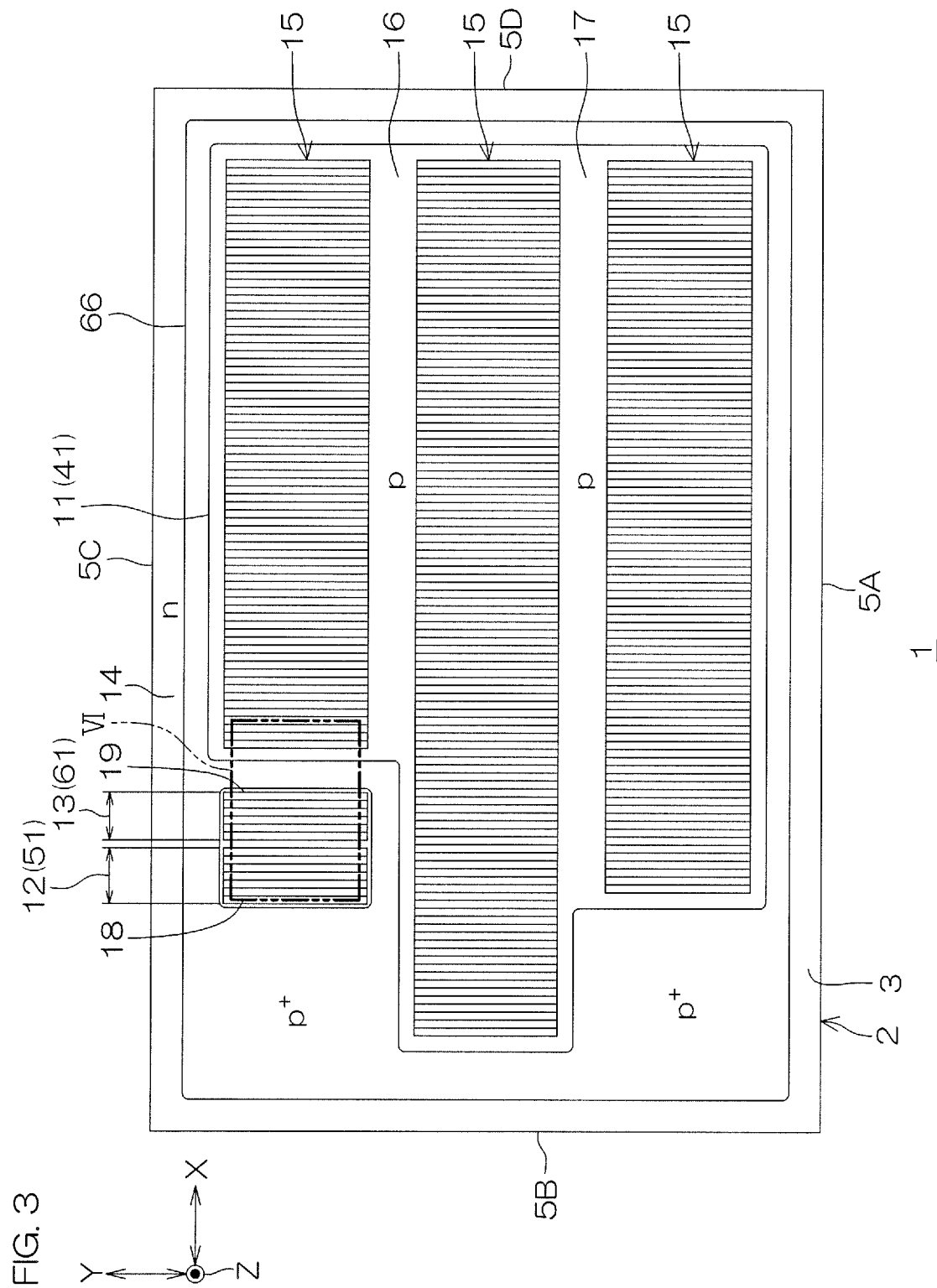
FIG. 3 is a plan view showing a structure of a first main surface of a semiconductor layer of the semiconductor device shown in FIG. 1.
Figure 4:
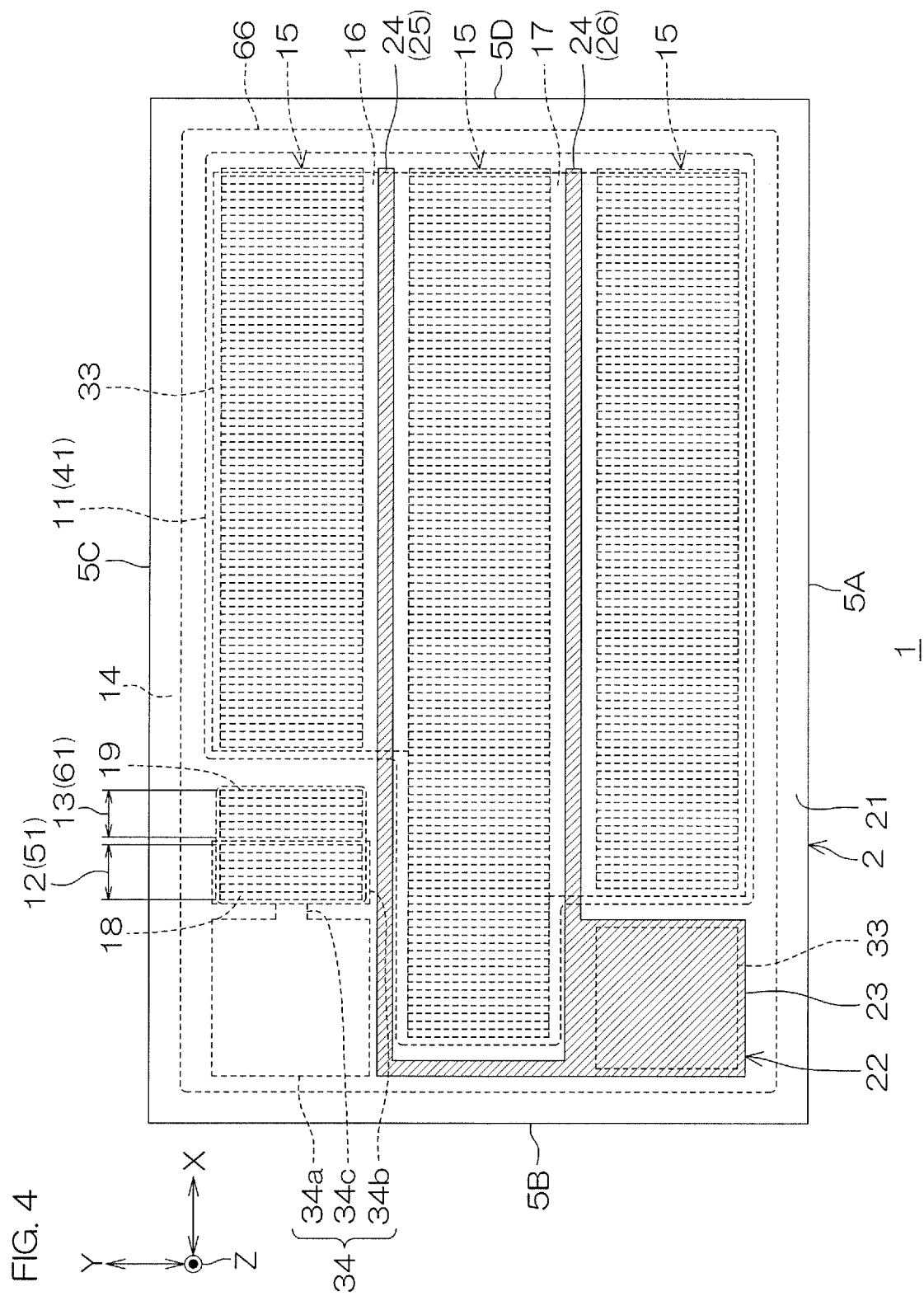
FIG. 4 is a plan view showing a structure of a gate wiring of the semiconductor device shown in FIG. 1.
Figure 5:
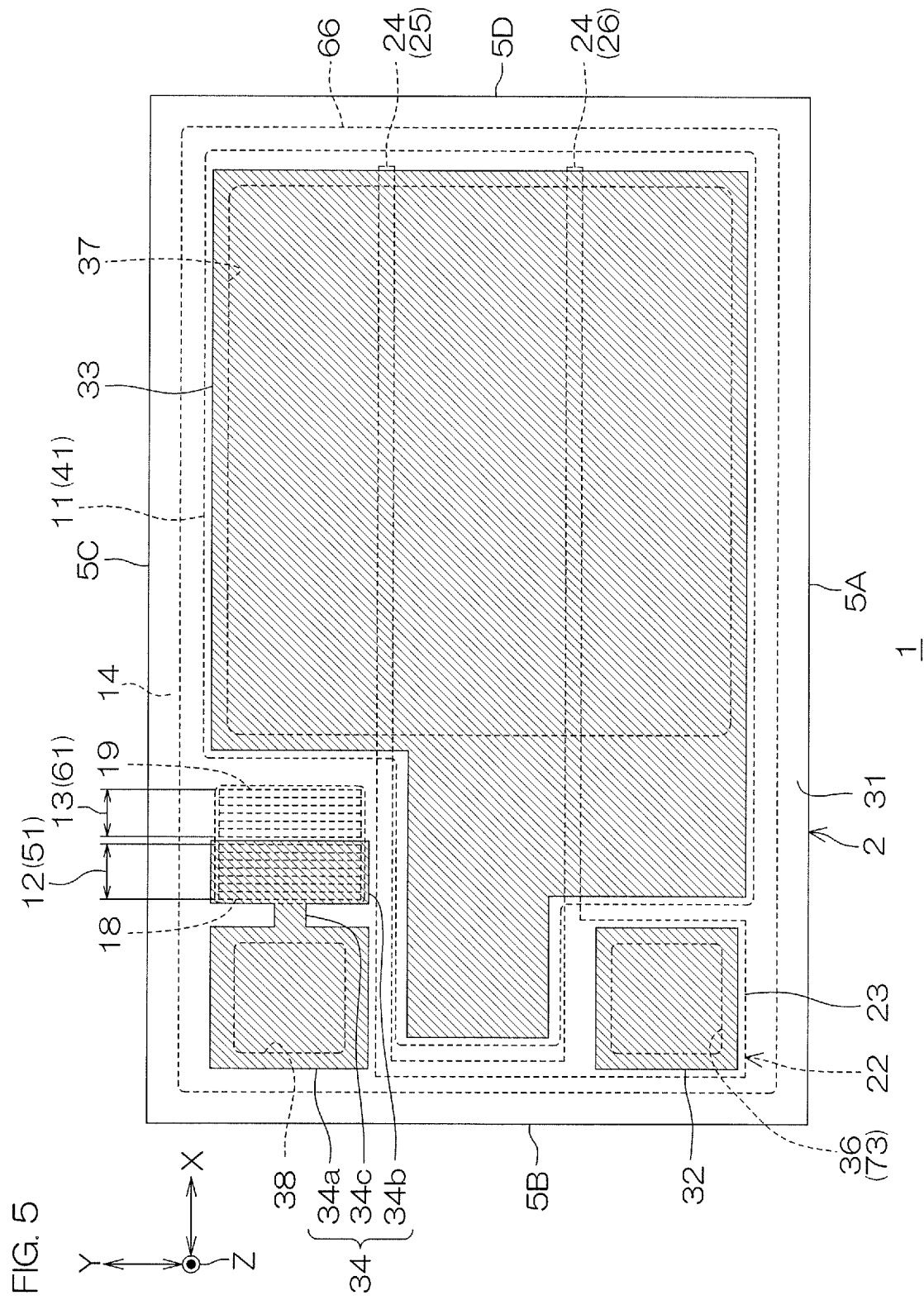
FIG. 5 is a plan view showing a structure of a gate terminal, an emitter terminal, and a current detection terminal of the semiconductor device shown in FIG. 1.

FIG. 1 is a perspective view of a semiconductor device 1 according to a first preferred embodiment of the present invention, which is seen from one angle. FIG. 2 is a plan view of the semiconductor device 1 shown in FIG. 1. FIG. 3 is a plan view showing a structure of a first main surface 3 of a semiconductor layer 2 of the semiconductor device 1 shown in FIG. 1. FIG. 4 is a plan view showing a structure of a gate wiring 22 of the semiconductor device 1 shown in FIG. 1. FIG. 5 is a plan view showing a structure of a gate terminal 32, an emitter terminal 33, and a current detection terminal 34 of the semiconductor device 1 shown in FIG. 1.

The semiconductor device 1 is an electronic component having an IGBT (Insulated Gate Bipolar Transistor) as an example of an insulated-gate type transistor in the present preferred embodiment.

Referring to FIG. 1, the semiconductor device 1 includes a semiconductor layer 2 of chip-shaped formed in a rectangular parallelepiped shape. The semiconductor layer 2 includes silicon. The semiconductor layer 2 has a first main surface 3 at one side, a second main surface 4 at the other side, and lateral surfaces 5A, 5B, 5C, 5D connecting the first main surface 3 and the second main surface 4. The first main surface 3 and the second main surface 4 are each formed in a quadrangular shape (in the present preferred embodiment, a rectangular shape) in plan view seen from a normal direction Z thereof (hereinafter, referred to simply as "in plan view").

The lateral surface 5A and the lateral surface 5C form a long side of the semiconductor layer 2, and face each other in a lateral direction (short-length direction) of the semiconductor layer 2. The lateral surface 5B and the lateral surface 5D form a short side of the semiconductor layer 2, and face each other in a longitudinal direction (long-length direction) of the semiconductor layer 2. Hereinafter, the direction along the lateral surfaces 5A and 5C is referred to as a first direction X, and the direction along the lateral surfaces 5B and 5D is referred to as a second direction Y.

The semiconductor layer 2 is formed as a drift region 6 of n-type included in the IGBT. The semiconductor layer 2 has a single-layer structure consisting of a semiconductor substrate 7 of n-type, in the present preferred embodiment. The semiconductor substrate 7 may be an FZ substrate formed through an FZ (Floating Zone) method.

The n-type impurity concentration of the semiconductor substrate 7 (drift region 6) may be not less than $1.0\times10^{13}$ $cm^{-3}$ and not more than $1.0\times10^{15}$ $cm^{-3}$. The thickness of the semiconductor substrate 7 may be not less than 50 μm and not more than 200 μm. The thickness of the semiconductor substrate 7 may be not less than 50 μm and not more than 100 µm, not less than 100 µm and not more than 150 µm, or not less than 150 µm and not more than 200 µm.

The semiconductor device 1 includes a buffer region 8 of $n^+$-type formed in a surface layer portion of the second main surface 4 of the semiconductor layer 2. The buffer region 8 may be formed in a whole area of the surface layer portion of the second main surface 4. The n-type impurity concentration of the buffer region 8 is larger than the n-type impurity concentration of the semiconductor substrate 7. The n-type impurity concentration of the buffer region 8 may be not less than $1.0 \times 10^{15}$ cm$^{-3}$ and not more than $1.0 \times 10^{17}$ cm$^{-3}$.

The semiconductor device 1 includes a collector region 9 of $p^+$-type formed in a surface layer portion at the second-main surface-4 side in the buffer region 8. The collector region 9 may be formed in a whole area of the surface layer portion of the buffer region 8. The p-type impurity concentration of the collector region 9 may be not less than $1.0 \times 10^{15}$ cm$^{-3}$ and not more than $1.0 \times 10^{18}$ cm$^{-3}$.

The semiconductor device 1 includes a collector terminal 10 formed on the second main surface 4 of the semiconductor layer 2. The collector terminal 10 forms an ohmic contact with the collector region 9.

Referring to FIG. 2 to FIG. 5 (particularly, FIG. 2 and FIG. 3), the semiconductor layer 2 includes an active region 11, a current detection region 12, a boundary region 13, and an outer region 14. The active region 11, the current detection region 12, the boundary region 13, and the outer region 14 are each set at the first main surface 3 of the semiconductor layer 2.

The active region 11 includes a main IGBT as a main device. The active region 11 is set at a central portion of the semiconductor layer 2 away from the lateral surfaces 5A to 5D of the semiconductor layer 2 to an inner region in plan view. The active region 11 is set to be a polygonal shape (quadrangular shape) a part of which projects toward the lateral-surface-5A side at a lateral-surface-5C-side region in plan view. The planar shape of the active region 11 is arbitrary, and is not limited to the shape shown in FIG. 2 to FIG. 5. A ratio SA/SS of a planar area SA of the active region 11 with respect to a planar area SS of the first main surface 3 of the semiconductor layer 2 may be not less than 0.5 and not more than 0.9.

The current detection region 12 includes a current detection IGBT as a current detection device. The current detection region 12 is set away from the active region 11. The current detection region 12 is set in an arbitrary region between the lateral surfaces 5A to 5D and the active region 11 in plan view.

The current detection region 12 is set in an inner region away from the lateral surfaces 5A to 5D in plan view. The current detection region 12 is set to be a belt shape that extends along the second direction Y in a lateral-surface-5A-side region in plan view, in the present preferred embodiment. The planar shape of the current detection region 12 is arbitrary. The planar area of the current detection region 12 is less than the planar area of the active region 11.

The boundary region 13 is set in a region between the active region 11 and the current detection region 12. The boundary region 13 is set to be a belt shape extending along the second direction Y in plan view. The planar shape of the boundary region 13 is arbitrary. The boundary region 13 is electrically separated from the active region 11 and from the current detection region 12.

The outer region 14 is a region outside the active region 11, the current detection region 12, and the boundary region 13. The outer region 14 is set to be a belt shape extending along a peripheral edge portion of the first main surface 3 in plan view. The outer region 14 is set to be an endless shape (quadrangular ring shape) that collectively surrounds the active region 11, the current detection region 12, and the boundary region 13 in plan view.

The active region 11 includes a single or a plurality of (in the present preferred embodiment, three) IGBT cells 15. Each of the IGBT cells 15 forms a part of the main IGBT. The plurality of IGBT cells 15 are each formed in a belt shape extending along the first direction X, and are arranged at intervals between the IGBT cells 15 along the second direction Y. The plurality of IGBT cells 15 are formed in a stripe shape extending along the first direction X as a whole. A first street 16 and a second street 17 are defined in regions between the plurality of mutually adjoining IGBT cells 15, respectively. The number of the IGBT cells 15, the length thereof in the first direction X, and the length thereof in the second direction Y are arbitrary, and are adjusted in accordance with the planar shape and the planar area of the active region 11.

The current detection region 12 includes a single or a plurality of current detection IGBT cells 18 (in the present preferred embodiment, one). The current detection IGBT cell 18 forms a current detection IGBT. The current detection IGBT cell 18 is formed in a belt shape extending along the second direction Y. The number of the current detection IGBT cells 18, the length thereof in the first direction X, and the length thereof in the second direction Y are arbitrary, and are adjusted in accordance with the planar shape and the planar area of the current detection region 12.

The boundary region 13 includes an electric field relaxation structure 19. The electric field relaxation structure 19 relaxes the electric field of the boundary region 13. The electric field relaxation structure 19 is formed in a belt shape extending along the second direction Y. A detailed structure of the IGBT cell 15, a detailed structure of the current detection IGBT cell 18, and a detailed structure of the electric field relaxation structure 19 will be described later.

Referring to FIG. 1 and FIG. 4, the semiconductor device 1 includes a main surface insulation layer 21 formed on the first main surface 3 of the semiconductor layer 2. The main surface insulation layer 21 selectively covers the first main surface 3 such as to be contiguous to the first main surface 3. The main surface insulation layer 21 may have a single-layer structure consisting of a silicon oxide ($SiO_2$) layer or a silicon nitride (SiN) layer. The main surface insulation layer 21 may have a layered structure including a silicon oxide layer and a silicon nitride layer. The silicon oxide layer may be formed on the silicon nitride layer. The silicon nitride layer may be formed on the silicon oxide layer. The main surface insulation layer 21 has a single-layer structure consisting of a silicon oxide layer in the present preferred embodiment.

The semiconductor device 1 includes a gate wiring 22 formed on the main surface insulation layer 21. The gate wiring 22 may include at least one kind of electroconductive polysilicon, aluminum, copper, an Al—Si—Cu (aluminum-silicon-copper) alloy, an Al—Si (aluminum-silicon) alloy, and an Al—Cu (aluminum-copper) alloy. The gate wiring 22 is made of an electroconductive polysilicon layer in the present preferred embodiment.

The gate wiring 22 includes a body portion 23 and a finger portion 24. The body portion 23 covers regions other than the active region 11, the current detection region 12, and the boundary region 13 in plan view. The body portion 23 is formed along a corner portion connecting the lateral surface 5A and the lateral surface 5B in plan view. The body portion 23 is formed in a quadrangular shape in plan view.

The finger portion 24 is drawn out of the body portion 23, and is selectively drawn around on the main surface insulation layer 21. The finger portion 24 transmits a gate signal to the active region 11 and to the current detection region 12. The finger portion 24 includes a first finger portion 25 and a second finger portion 26 in the present preferred embodiment.

The first finger portion 25 crosses the current detection region 12 from the body portion 23, and is drawn around into the active region 11. The first finger portion 25 extends in a belt shape along the first street 16 in the active region 11. The first finger portion 25 transmits the gate signal to the active region 11 and to the current detection region 12. A transmission delay of the gate signal from the body portion 23 to the current detection region 12 is prevented by forming the current detection region 12 in a region between the body portion 23 and the active region 11.

The second finger portion 26 is drawn around into the active region 11 without crossing the current detection region 12 from the body portion 23. The first finger portion 25 extends in a belt shape along the second street 17 in the active region 11. The second finger portion 26 transmits the gate signal to the active region 11.

A total extension from the body portion 23 to a farthest part of the current detection region 12 in the finger portion 24 is less than a total extension from the body portion 23 to a farthest part of the active region 11 in the finger portion 24. A response speed of the current detection region 12 with respect to the gate signal is higher than a response speed of the active region 11 with respect to the gate signal.

Referring to FIG. 1 and FIG. 5, the semiconductor device 1 includes an interlayer insulation layer 31 formed on the main surface insulation layer 21. The interlayer insulation layer 31 selectively covers the main surface insulation layer 21 such as to cover the gate wiring 22. The interlayer insulation layer 31 is contiguous to the main surface insulation layer 21. The interlayer insulation layer 31 may have a single-layer structure consisting of a single insulation layer, or may have a layered structure including a plurality of insulation layers. A detailed structure of the interlayer insulation layer 31 will be described later.

The semiconductor device 1 includes the gate terminal 32, the emitter terminal 33, and the current detection terminal 34 that are formed on the interlayer insulation layer 31. The gate terminal 32 is a terminal to which the gate signal is input. The emitter terminal 33 is a terminal to which a reference voltage (for example, ground voltage) is applied. The current detection terminal 34 is a terminal to which a reference voltage (for example, ground voltage) is applied.

The gate terminal 32, the emitter terminal 33, and the current detection terminal 34 may each include at least one kind of aluminum, copper, an Al—Si—Cu (aluminum-silicon-copper) alloy, an Al—Si (aluminum-silicon) alloy, and an Al—Cu (aluminum-copper) alloy.

The gate terminal 32 covers regions other than the active region 11, the current detection region 12, and the boundary region 13 in plan view. The gate terminal 32 is formed along a corner portion connecting the lateral surface 5A and the lateral surface 5B in plan view in the present preferred embodiment. The gate terminal 32 is formed in a quadrangular shape in plan view. The gate terminal 32 passes through the interlayer insulation layer 31, and is electrically connected to the body portion 23 of the gate wiring 22.

The emitter terminal 33 covers the active region 11 in plan view. The emitter terminal 33 is formed in a lateral-surface-5D-side region away from the gate terminal 32 in plan view. A planar area of the emitter terminal 33 is larger than a planar area of the gate terminal 32 and a planar area of the current detection terminal 34. The emitter terminal 33 passes through the interlayer insulation layer 31, and is electrically connected to the active region 11 selectively.

The current detection terminal 34 covers the current detection region 12 in plan view. The current detection terminal 34 is formed in a lateral-surface-5B-side region away from the gate terminal 32 and away from the emitter terminal 33. The current detection terminal 34 is formed along a corner portion connecting the lateral surface 5B and the lateral surface 5C in plan view in the present preferred embodiment.

In detail, the current detection terminal 34 includes a first portion 34a, a second portion 34b, and a connection portion 34c. The first portion 34a covers regions outside the current detection region 12. The first portion 34a is formed in a quadrangular shape in plan view in the present preferred embodiment.

The second portion 34b covers the current detection region 12. The second portion 34b is formed in a belt shape extending along the current detection region 12 in plan view in the present preferred embodiment. The second portion 34b passes through the interlayer insulation layer 31, and is electrically connected to the current detection region 12 selectively.

The connection portion 34c connects the first portion 34a and the second portion 34b together. Regarding to the second direction Y, a width of the connection portion 34c is less than a width of the first portion 34a and a width of the second portion 34b. The width of the first portion 34a, the width of the second portion 34b, and the width of the connection portion 34c may be equal to each other.

Referring to FIG. 1 and FIG. 2, the semiconductor device 1 includes a resin layer 35 formed on the interlayer insulation layer 31. The resin layer 35 is shown by hatching in FIG. 2. The resin layer 35 may include a negative type resin or positive type photosensitive resin. The resin layer 35 includes polyimide as an example of the negative type photosensitive resin in the present preferred embodiment. The resin layer 35 may include polybenzoxazole as an example of the positive type photosensitive resin.

The resin layer 35 has a gate pad opening 36, an emitter pad opening 37, and a current detection pad opening 38. The gate pad opening 36 exposes a region of a part of the gate terminal 32 as a pad region. The emitter pad opening 37 exposes a region of a part of the emitter terminal 33 as a pad region. The current detection pad opening 38 exposes a region of a part of the current detection terminal 34 as a pad region. The gate pad opening 36, the emitter pad opening 37, and the current detection pad opening 38 are each formed in a quadrangular shape that has four sides parallel to the lateral surfaces 5A to 5D, respectively, in plan view in the present preferred embodiment.

A peripheral edge portion of the resin layer 35 is formed in an inner region away from the lateral surfaces 5A to 5D in plan view, and exposes the peripheral edge portion of the first main surface 3 (interlayer insulation layer 31). The peripheral edge portion of the resin layer 35 defines a dicing street with the lateral surfaces 5A to 5D. The peripheral edge portion of the first main surface 3 (interlayer insulation layer 31) is exposed from the dicing street, and, as a result, the resin layer 35 is not required to be physically cut when the semiconductor device 1 is cut out from one semiconductor wafer. This makes it possible to smoothly cut out the semiconductor device 1 from one semiconductor wafer.

Figure 6:
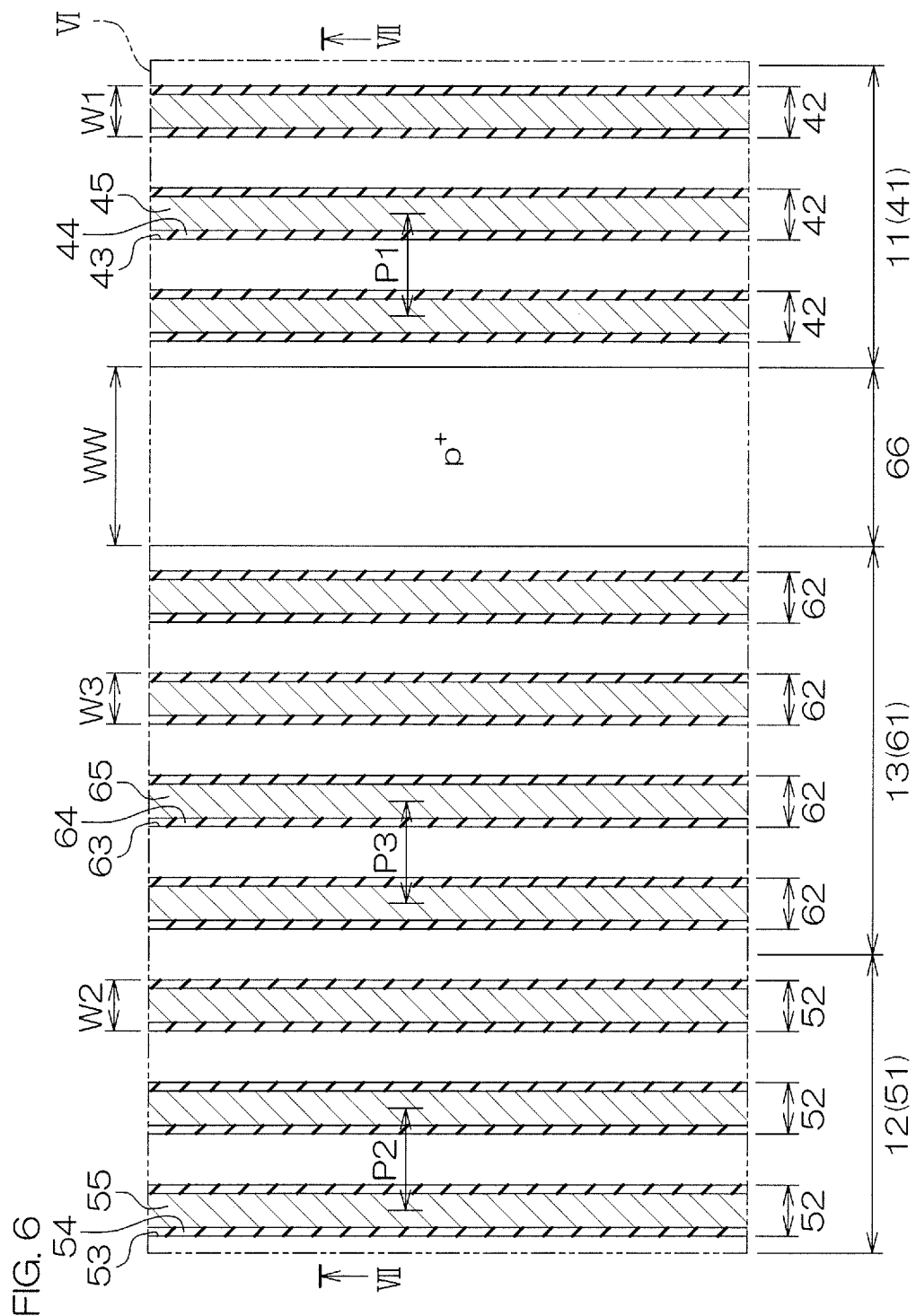
FIG. 6 is an enlarged view of region VI shown in FIG. 3.
Figure 7:
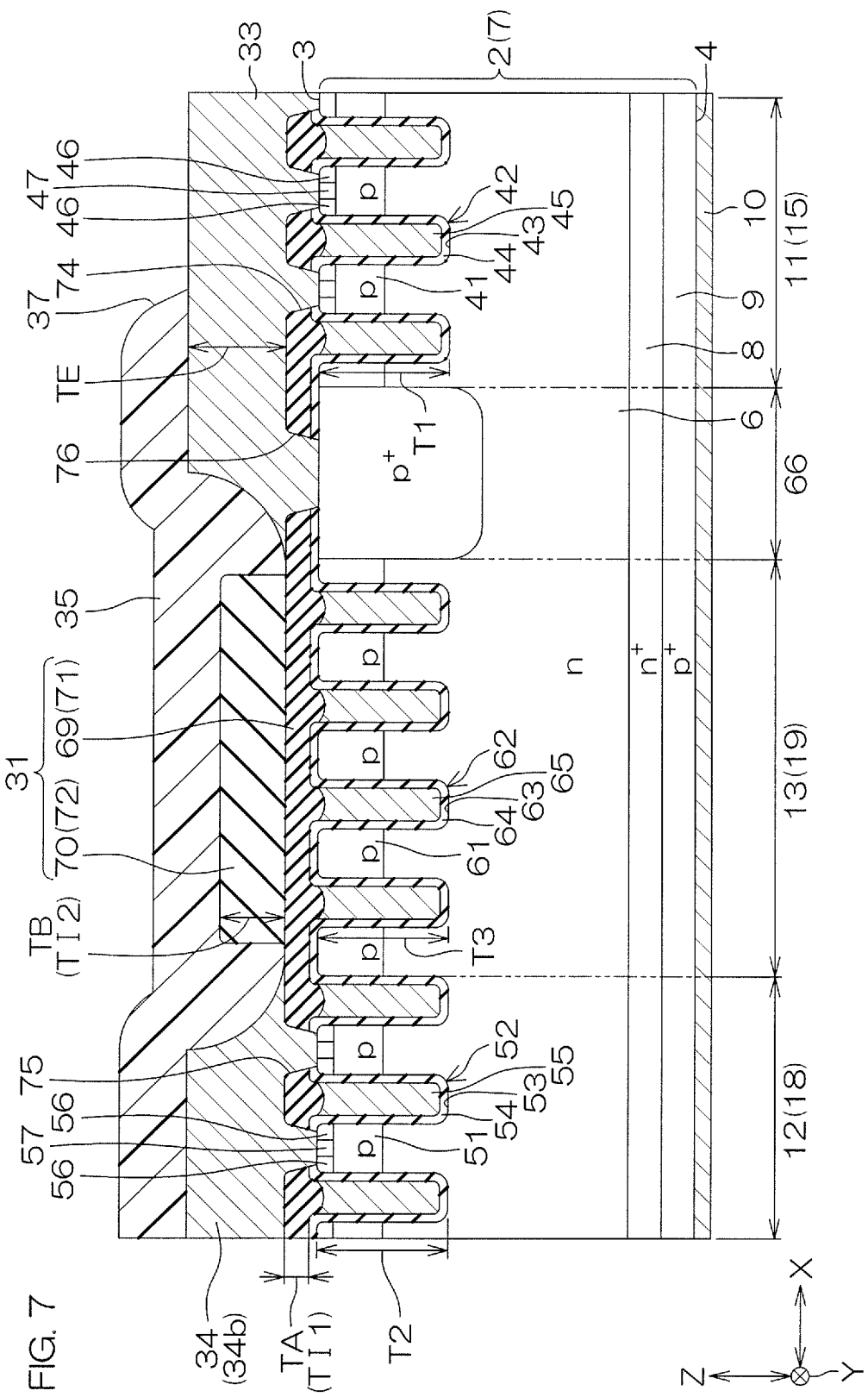
FIG. 7 is a cross-sectional view taken along line VII-VII shown in FIG. 6.

A detailed structure of the semiconductor device 1 will be hereinafter described with reference to FIG. 6 and FIG. 7 in addition to FIG. 1 to FIG. 5. FIG. 6 is an enlarged view of region VI shown in FIG. 3. FIG. 7 is a cross-sectional view taken along line VII-VII shown in FIG. 6.

Referring to FIG. 2 to FIG. 7, the semiconductor device 1 includes a first body region 41 of p-type formed in a surface layer portion of the first main surface 3 of the semiconductor layer 2 at the active region 11. The first body region 41 defines the active region 11. The p-type impurity concentration of the first body region 41 may be not less than $1.0 \times 10^{17}$ cm$^{-3}$ and not more than $1.0 \times 10^{18}$ cm$^{-3}$.

A depth of the first body region 41 may be not less than 1.0 µm and not more than 5.0 µm. The depth of the first body region 41 may be not less than 1.0 µm and not more than 2.0 µm, not less than 2.0 µm and not more than 3.0 µm, not less than 3.0 µm and not more than 4.0 µm, or not less than 4.0 µm and not more than 5.0 µm. The depth of the first body region 41 is preferably not less than 1.5 µm and not more than 4.0 µm.

Each of the IGBT cells 15 includes a plurality of first trench gate structures 42 formed in the first main surface 3 of the semiconductor layer 2 at the active region 11. The plurality of first trench gate structures 42 are formed with intervals between the first trench gate structures 42 along the first direction X, and are each formed in a belt shape extending along the second direction Y. The plurality of first trench gate structures 42 are formed in a stripe shape extending along the second direction Y as a whole. Each of the first trench gate structures 42 passes through the first body region 41, and a bottom portion of each of the first trench gate structures 42 is positioned inside the drift region 6.

Regarding to the normal direction Z, a first thickness T1 of each of the first trench gate structures 42 may be not less than 1 µm and not more than 10 µm. The first thickness T1 may be not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. The first thickness T1 is preferably not less than 2 µm and not more than 6 µm.

Regarding to the first direction X, a first width W1 of each of the first trench gate structures 42 may be not less than 0.1 µm and not more than 3.0 µm. The first width W1 may be not less than 0.1 µm and not more than 0.5 µm, not less than 0.5 µm and not more than 1.0 µm, not less than 1.0 µm and not more than 1.5 µm, not less than 1.5 µm and not more than 2.0 µm, not less than 2.0 µm and not more than 2.5 µm, or not less than 2.5 µm and not more than 3.0 µm. The first width W1 is preferably not less than 0.5 µm and not more than 2.0 µm.

Regarding to the first direction X, a first pitch P1 of the plurality of first trench gate structures 42 may be not less than 1 µm and not more than 10 µm. The first pitch P1 is a distance between central portions of two first trench gate structures 42 that adjoin each other. The first pitch P1 may be not less than 1 µm and not more than 2 µm, not less than 2 µm and not more than 4 µm, not less than 4 µm and not more than 6 µm, not less than 6 µm and not more than 8 µm, or not less than 8 µm and not more than 10 µm. The first pitch P1 is preferably not less than 3 µm and not more than 10 µm.

The gate signal from the gate terminal 32 is input to each of the first trench gate structures 42. In detail, each of the first trench gate structures 42 is electrically connected to the gate wiring 22 (finger portion 24) in a region not shown.

Hence, the gate signal from the gate terminal 32 is transmitted to the first trench gate structures 42 through the gate wiring 22.

Each of the first trench gate structures 42, more specifically, includes a first gate trench 43, a first gate insulation layer 44, and a first gate electrode layer 45. The first gate trench 43 is formed by digging down the first main surface 3 toward the second main surface 4. The first gate trench 43 passes through the first body region 41. A bottom portion of the first gate trench 43 is positioned inside the drift region 6.

The first gate insulation layer 44 is formed in a film shape along an inner wall of the first gate trench 43. The first gate insulation layer 44 defines a recessed space inside the first gate trench 43. The first gate insulation layer 44 may have a single-layer structure consisting of a silicon oxide ($SiO_2$) layer or a silicon nitride (SiN) layer. The first gate insulation layer 44 may have a layered structure including a silicon oxide layer and a silicon nitride layer. The silicon oxide layer may be formed on the silicon nitride layer. The silicon nitride layer may be formed on the silicon oxide layer. The first gate insulation layer 44 has a single-layer structure consisting of a silicon oxide layer in the present preferred embodiment.

The first gate electrode layer 45 is embedded in the first gate trench 43 with the first gate insulation layer 44 between the first gate electrode layer 45 and the first gate trench 43. In detail, the first gate electrode layer 45 is embedded in the recessed space defined by the first gate insulation layer 44 in the first gate trench 43. A part of the first gate electrode layer 45 is drawn out of the first gate trench 43 onto the first main surface 3 (specifically, onto the main surface insulation layer 21), and is connected to the finger portion 24 of the gate wiring 22.

In detail, the part of the first gate electrode layer 45 is drawn out onto the first street 16 or onto the second street 17 depending on the disposition, and is connected to the finger portion 24 of the gate wiring 22. The first gate electrode layer 45 may be formed integrally with the gate wiring 22. In this case, it is possible to form the first gate electrode layer 45 and the gate wiring 22 by using the same mask.

The first gate electrode layer 45 may include at least one kind of electroconductive polysilicon, tungsten, titanium, titanium nitride, aluminum, copper, an Al—Si—Cu (aluminum-silicon-copper) alloy, an Al—Si (aluminum-silicon) alloy, and an Al—Cu (aluminum-copper) alloy. The first gate electrode layer 45 consists of an electroconductive polysilicon layer in the present preferred embodiment.

Each of the IGBT cells 15 further includes a plurality of first emitter regions 46 of n$^+$-type formed in a surface layer portion of the first body region 41 at the active region 11. The n-type impurity concentration of the first emitter region 46 may be not less than $1.0 \times 10^{19}$ cm$^{-3}$ and not more than $1.0 \times 10^{20}$ cm$^{-3}$.

The plurality of first emitter regions 46 are formed at one lateral surface or both lateral surfaces of each of the first trench gate structures 42. Each of the plurality of first emitter regions 46 extends in a belt shape along the first trench gate structure 42 in plan view. Each of the first emitter regions 46 is exposed from the first main surface 3. Each of the first emitter regions 46 is exposed from the lateral surface of the first gate trench 43 corresponding thereto. Each of the first emitter regions 46 faces the first gate electrode layer 45 across the first gate insulation layer 44 corresponding thereto. A bottom portion of each of the first emitter regions 46 is positioned at the first-main surface-3 side with respect to a bottom portion of the first body region 41.

Each of the IGBT cells 15 further includes a plurality of first contact regions 47 of p+ type formed in the surface layer portion of the first body region 41 at the active region 11. The p-type impurity concentration of the first contact region 47 is larger than the p-type impurity concentration of the first body region 41. The p-type impurity concentration of the first contact region 47 may be not less than $1.0 \times 10^{19}$ cm$^{-3}$ and not more than $1.0 \times 10^{20}$ cm$^{-3}$.

Each of the first contact regions 47 is formed in a region between two first trench gate structures 42 that adjoin each other. Each of the first contact regions 47 is formed in a region that faces the first trench gate structures 42 with the first emitter region 46 between the first contact region 47 and the first trench gate structure 42 in the surface layer portion of the first body region 41 in the present preferred embodiment. Each of the first contact regions 47 is exposed from the first main surface 3.

Each of the first contact regions 47 may extend in a belt shape along the first trench gate structures 42 in plan view. The plurality of first contact regions 47 may be formed with intervals between the first contact regions 47 along the first trench gate structures 42. A bottom portion of the first contact region 47 may be positioned in a region between the bottom portion of the first body region 41 and the bottom portion of the first emitter region 46.

As thus described, the first emitter region 46, the first body region 41, and the drift region 6 are formed from the first main surface 3 toward the second main surface 4 beside each of the first gate trenches 43. A channel of the main IGBT is formed in a region between the first emitter region 46 and the drift region 6 in the first body region 41. The on/off of the channel of the main IGBT is controlled by the gate signal.

Referring to FIG. 2 to FIG. 7, the semiconductor device 1 includes a second body region 51 of p-type formed in the surface layer portion of the first main surface 3 of the semiconductor layer 2 at the current detection region 12. The second body region 51 is formed away from the first body region 41 (active region 11), and is electrically separated from the first body region 41 (active region 11). The second body region 51 defines the current detection region 12. The p-type impurity concentration of the second body region 51 may be not less than $1.0 \times 10^{17}$ cm$^{-3}$ and not more than $1.0 \times 10^{18}$ cm$^{-3}$.

A depth of the second body region 51 may be not less than 1.0 μm and not more than 5.0 μm. The depth of the second body region 51 may be not less than 1.0 μm and not more than 2.0 μm, not less than 2.0 μm and not more than 3.0 μm, not less than 3.0 μm and not more than 4.0 μm, or not less than 4.0 μm and not more than 5.0 μm. The depth of the second body region 51 is preferably not less than 1.5 μm and not more than 4.0 μm.

The p-type impurity concentration of the second body region 51 is preferably equal to the p-type impurity concentration of the first body region 41. The depth of the second body region 51 is preferably equal to the depth of the first body region 41. If both of the two conditions are satisfied, it is possible to form the first body region 41 and the second body region 51 by using the same mask.

The current detection IGBT cell 18 includes a plurality of second trench gate structures 52 formed in the first main surface 3 of the semiconductor layer 2 at the current detection region 12. The plurality of second trench gate structures 52 are formed with intervals between the second trench gate structures 52 along the first direction X, and are each formed in a belt shape extending along the second direction Y. The plurality of second trench gate structures 52 are formed in a stripe shape extending along the second direction Y as a whole. In other words, the plurality of second trench gate structures 52 extend along the same direction as the direction along which the plurality of first trench gate structures 42 extend. Each of the second trench gate structures 52 passes through the second body region 51. A bottom portion of each of the second trench gate structures 52 is positioned inside the drift region 6.

Regarding to the normal direction Z, a second thickness T2 of each of the second trench gate structures 52 may be not less than 1 μm and not more than 10 μm. The second thickness T2 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The second thickness T2 is preferably not less than 2 μm and not more than 6 μm. The second thickness T2 is preferably equal to the first thickness T1 of the first trench gate structure 42.

Regarding to the first direction X, a second width W2 of each of the second trench gate structures 52 may be not less than 0.1 μm and not more than 3.0 μm. The second width W2 may be not less than 0.1 μm and not more than 0.5 μm, not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm. The second width W2 is preferably not less than 0.5 μm and not more than 2.0 μm. The second width W2 is preferably equal to the first width W1 of the first trench gate structure 42.

Regarding to the first direction X, a second pitch P2 of the plurality of second trench gate structures 52 may be not less than 1 μm and not more than 10 μm. The second pitch P2 is a distance between central portions of two second trench gate structures 52 that adjoin each other. The second pitch P2 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The second pitch P2 is preferably not less than 3 μm and not more than 10 μm. The second pitch P2 is preferably equal to the first pitch P1 of the first trench gate structures 42.

The gate signal from the gate terminal 32 is input to each of the second trench gate structures 52. In detail, each of the second trench gate structures 52 is electrically connected to the gate wiring 22 (finger portion 24) in a region not shown. Hence, the gate signal from the gate terminal 32 is transmitted to the second trench gate structure 52 through the gate wiring 22.

Each of the second trench gate structures 52, more specifically, includes a second gate trench 53, a second gate insulation layer 54, and a second gate electrode layer 55. The second gate trench 53 is formed by digging down the first main surface 3 of the semiconductor layer 2 toward the second main surface 4. The second gate trench 53 passes through the second body region 51. A bottom portion of the second gate trench 53 is positioned inside the drift region 6.

The second gate insulation layer 54 is formed in a film shape along an inner wall of the second gate trench 53. The second gate insulation layer 54 defines a recessed space inside the second gate trench 53. The second gate insulation layer 54 may have a single-layer structure consisting of a silicon oxide ($SiO_2$) layer or a silicon nitride (SiN) layer. The second gate insulation layer 54 may have a layered structure including a silicon oxide layer and a silicon nitride layer. The silicon oxide layer may be formed on the silicon nitride layer. The silicon nitride layer may be formed on the silicon oxide layer. The second gate insulation layer 54 has a single-layer structure consisting of a silicon oxide layer in the present preferred embodiment.

The second gate electrode layer 55 is embedded in the second gate trench 53 with the second gate insulation layer 54 between the second gate electrode layer 55 and the second gate trench 53. In detail, the second gate electrode layer 55 is embedded in the recessed space defined by the second gate insulation layer 54 in the second gate trench 53.

A part of the second gate electrode layer 55 is drawn out of the second gate trench 53 onto the first main surface 3 (specifically, onto the main surface insulation layer 21), and is connected to the finger portion 24 (in the present preferred embodiment, the first finger portion 25) of the gate wiring 22. The second gate electrode layer 55 may be formed integrally with the gate wiring 22. In this case, it is possible to form the second gate electrode layer 55 and the gate wiring 22 by using the same mask.

The second gate electrode layer 55 may include at least one kind of electroconductive polysilicon, tungsten, titanium, titanium nitride, aluminum, copper, an Al—Si—Cu (aluminum-silicon-copper) alloy, an Al—Si (aluminum-silicon) alloy, and an Al—Cu (aluminum-copper) alloy. The second gate electrode layer 55 consists of an electroconductive polysilicon layer in the present preferred embodiment.

The second trench gate structure 52 preferably has the same structure as the first trench gate structure 42. In this case, it is possible to form the first trench gate structure 42 and the second trench gate structure 52 by using the same mask.

The current detection IGBT cell 18 includes a plurality of second emitter regions 56 of $n^+$-type formed in a surface layer portion of the second body region 51 at the current detection region 12. The n-type impurity concentration of the second emitter region 56 may be not less than $1.0 \times 10^{19}$ $cm^{-3}$ and not more than $1.0 \times 10^{20}$ $cm^{-3}$.

The plurality of second emitter regions 56 are formed at one lateral surface or both lateral surfaces of each of the second trench gate structures 52. Each of the plurality of second emitter regions 56 extends in a belt shape along the second trench gate structure 52 in plan view. Each of the second emitter regions 56 is exposed from the first main surface 3. Each of the second emitter regions 56 is exposed from a sidewall of the second gate trench 53 corresponding thereto. Each of the second emitter regions 56 faces the second gate electrode layer 55 through the second gate insulation layer 54 corresponding thereto. A bottom portion of each of the second emitter regions 56 is positioned on the first-main surface-3 side with respect to a bottom portion of the second body region 51.

The depth of the second emitter region 56 is preferably equal to the depth of the first emitter region 46. The n-type impurity concentration of the second emitter region 56 is preferably equal to the n-type impurity concentration of the first emitter region 46. If both of the two conditions are satisfied, it is possible to form the first emitter region 46 and the second emitter region 56 by using the same mask.

The current detection IGBT cell 18 includes a plurality of second contact regions 57 of $p^+$-type formed in the surface layer portion of the second body region 51 at the current detection region 12. The p-type impurity concentration of the second contact region 57 is larger than the p-type impurity concentration of the second body region 51. The p-type impurity concentration of the second contact region 57 may be not less than $1.0 \times 10^{19}$ $cm^{-3}$ and not more than $1.0 \times 10^{20}$ $cm^{-3}$.

Each of the second contact regions 57 is formed in a region between two second trench gate structures 52 that adjoin each other. Each of the second contact regions 57 is formed in a region that faces the second trench gate structures 52 with the second emitter region 56 between the second contact region 57 and the second trench gate structure 52 in the surface layer portion of the second body region 51 in the present preferred embodiment. Each of the second contact regions 57 is exposed from the first main surface 3.

Each of the second contact regions 57 may extend in a belt shape along the second trench gate structures 52 in plan view. The plurality of second contact regions 57 may be formed with intervals between the second contact regions 57 along the second trench gate structures 52. A bottom portion of the second contact region 57 may be positioned in a region between the bottom portion of the second body region 51 and the bottom portion of the second emitter region 56.

The depth of the second contact region 57 is preferably equal to the depth of the first contact region 47. The p-type impurity concentration of the second contact region 57 is preferably equal to the p-type impurity concentration of the first contact region 47. If both of the two conditions are satisfied, it is possible to form the first contact region 47 and the second contact region 57 by using the same mask.

As thus described, the second emitter region 56, the second body region 51, and the drift region 6 are formed from the first main surface 3 toward the second main surface 4 beside each of the second gate trenches 53. A channel of the current detection IGBT is formed in a region between the second emitter region 56 and the drift region 6 in the second body region 51. The on/off of the channel of the current detection IGBT is controlled by the gate signal.

A ratio I2/I1 of a second electric current I2 flowing through the current detection region 12 with respect to a first electric current I1 flowing through the active region 11 may be not less than 1/10000 and not more than 1/100. The ratio I2/I1 may be not less than 1/10000 and not more than 1/5000, not less than 1/5000 and not more than 1/3000, not less than 1/3000 and not more than 1/1000, not less than 1/1000 and not more than 1/500, or not less than 1/500 and not more than 1/100. The ratio I2/I1 is preferably not less than 1/3000 and not more than 1/500.

A number of the second trench gate structures 52 is less than a number of the first trench gate structures 42. A planar area of the current detection region 12 is less than a planar area of the active region 11. A total parasitic capacitance formed in a region between the plurality of second trench gate structures 52 and the semiconductor layer 2 is less than a total parasitic capacitance formed in a region between the plurality of first trench gate structures 42 and the semiconductor layer 2. In other words, a capacitance value of the current detection region 12 is less than a capacitance value of the active region 11. Therefore, the response speed of the current detection region 12 (current detection IGBT) is higher than the response speed of the active region 11 (main IGBT).

Referring to FIG. 2 to FIG. 7, the semiconductor device 1 includes a well region 61 of p-type formed in the surface layer portion of the first main surface 3 of the semiconductor layer 2 at the boundary region 13. The well region 61 defines the boundary region 13. The well region 61 is electrically separated from the first body region 41 (active region 11) and from the second body region 51 (current detection region 12). The p-type impurity concentration of the well region 61 may be not less than $1.0 \times 10^{17}$ $cm^{-3}$ and not more than $1.0 \times 10^{18}$ $cm^{-3}$.

A depth of the well region 61 may be not less than 1.0 μm and not more than 5.0 μm. The depth of the well region 61 may be not less than 1.0 μm and not more than 2.0 μm, not less than 2.0 μm and not more than 3.0 μm, not less than 3.0 μm and not more than 4.0 μm, or not less than 4.0 μm and not more than 5.0 μm. The depth of the well region 61 is preferably not less than 1.5 μm and not more than 4.0 μm.

The p-type impurity concentration of the well region 61 is preferably equal to the p-type impurity concentration of the first body region 41. The depth of the well region 61 is preferably equal to the depth of the first body region 41. If both of the two conditions are satisfied, it is possible to form the first body region 41 and the well region 61 by using the same mask.

Regarding to the first direction X, a width WW of the well region 61 (boundary region 13) may be not less than 10 μm and not more than 200 μm. The width WW may be not less than 10 μm and not more than 50 μm, not less than 50 μm and not more than 100 μm, not less than 100 μm and not more than 150 μm, or not less than 150 μm and not more than 200 μm. The width WW is preferably not less than 10 μm and not more than 50 μm.

The electric field relaxation structure 19 includes a single or a plurality of (two or more. In the present preferred embodiment, four) dummy trench gate structures 62 formed in the first main surface 3 of the semiconductor layer 2 at the boundary region 13. A number of the dummy trench gate structures 62 is adjusted in accordance with the width WW of the well region 61.

The plurality of dummy trench gate structures 62 are formed in an electrically floating state. An electric contact with respect to the plurality of dummy trench gate structures 62 is not made. In other words, the plurality of dummy trench gate structures 62 are not electrically connected to the gate terminal 32 (gate wiring 22).

The plurality of dummy trench gate structures 62 are formed with intervals between the dummy trench gate structures 62 along the first direction X, and are each formed in a belt shape extending along the second direction Y. The plurality of dummy trench gate structures 62 are formed in a stripe shape extending along the second direction Y as a whole. In other words, the plurality of dummy trench gate structures 62 extend along the same direction as the direction along which the plurality of second trench gate structures 52 extend. Each of the dummy trench gate structures 62 passes through the well region 61. A bottom portion of each of the dummy trench gate structures 62 is positioned inside the drift region 6.

Regarding to the normal direction Z, a third thickness T3 of each of the dummy trench gate structures 62 may be not less than 1 μm and not more than 10 μm. The third thickness T3 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The third thickness T3 is preferably not less than 2 μm and not more than 6 μm. The third thickness T3 is preferably equal to the second thickness T2 of the second trench gate structure 52. The third thickness T3 is preferably equal to the first thickness T1 of the first trench gate structure 42.

Regarding to the first direction X, a third width W3 of each of the dummy trench gate structures 62 may be not less than 0.1 μm and not more than 3.0 μm. The third width W3 may be not less than 0.1 μm and not more than 0.5 μm, not less than 0.5 μm and not more than 1.0 μm, not less than 1.0 μm and not more than 1.5 μm, not less than 1.5 μm and not more than 2.0 μm, not less than 2.0 μm and not more than 2.5 μm, or not less than 2.5 μm and not more than 3.0 μm.

The third width W3 is preferably not less than 0.5 μm and not more than 2.0 μm. The third width W3 is preferably equal to the second width W2 of the second trench gate structure 52. The third width W3 is preferably equal to the first width W1 of the first trench gate structure 42.

Regarding to the first direction X, a third pitch P3 of the plurality of dummy trench gate structures 62 may be not less than 1 μm and not more than 10 μm. The third pitch P3 is a distance between central portions of two dummy trench gate structures 62 that adjoin each other. The third pitch P3 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm. The third pitch P3 is preferably not less than 3 μm and not more than 10 μm.

The third pitch P3 is preferably equal to the second pitch P2 of the second trench gate structure 52. The third pitch P3 is preferably equal to the first pitch P1 of the first trench gate structure 42.

Each of the dummy trench gate structures 62, more specifically, includes a dummy gate trench 63, a dummy gate insulation layer 64, and a dummy gate electrode layer 65. The dummy gate trench 63 is formed by digging down the first main surface 3 toward the second main surface 4. The dummy gate trench 63 passes through the well region 61. A bottom portion of the dummy gate trench 63 is positioned inside the drift region 6.

The dummy gate insulation layer 64 is formed in a film shape along an inner wall of the dummy gate trench 63. The dummy gate insulation layer 64 defines a recessed space inside the dummy gate trench 63. The dummy gate insulation layer 64 may have a single-layer structure consisting of a silicon oxide ($SiO_2$) layer or a silicon nitride (SiN) layer. The dummy gate insulation layer 64 may have a layered structure including a silicon oxide layer and a silicon nitride layer. The silicon oxide layer may be formed on the silicon nitride layer. The silicon nitride layer may be formed on the silicon oxide layer. The dummy gate insulation layer 64 has a single-layer structure consisting of a silicon oxide layer in the present preferred embodiment.

The dummy gate electrode layer 65 is embedded in the dummy gate trench 63 with the dummy gate insulation layer 64 between the dummy gate electrode layer 65 and the dummy gate trench 63. In detail, the dummy gate electrode layer 65 is embedded in the recessed space defined by the dummy gate insulation layer 64 in the dummy gate trench 63.

The dummy gate electrode layer 65 may include at least one kind of electroconductive polysilicon, tungsten, titanium, titanium nitride, aluminum, copper, an Al—Si—Cu (aluminum-silicon-copper) alloy, an Al—Si (aluminum-silicon) alloy, and an Al—Cu (aluminum-copper) alloy. The dummy gate electrode layer 65 preferably consists of an electroconductive polysilicon layer. In this case, it is possible to form the first gate electrode layer 45 and the dummy gate electrode layer 65 by using the same mask.

The dummy trench gate structure 62 preferably has the same structure as the second trench gate structure 52. In this case, it is possible to form the second trench gate structure 52 and the dummy trench gate structure 62 by using the same mask.

Referring to FIG. 2 to FIG. 7, the semiconductor device 1 includes a deep well region 66 of $p^+$-type formed in a region other than the active region 11, the current detection region 12, and the boundary region 13 in the surface layer portion of the first main surface 3 of the semiconductor layer 2. The deep well region 66 is referred to also as a main junction region with respect to the active region 11.

The deep well region 66 is formed in a region surrounded by the outer region 14. The deep well region 66 is formed in an endless shape that surrounds the active region 11 in plan view. The deep well region 66 collectively surrounds the current detection region 12 and the boundary region 13.

The deep well region 66 is formed in a region that overlaps with the gate terminal 32 and the current detection terminal 34 in plan view. In the thus formed structure, the boundary region 13 is formed in a region between the current detection region 12 and the deep well region 66.

The deep well region 66 is formed more deeply than the first body region 41, the second body region 51, and the well region 61. A bottom portion of the deep well region 66 is positioned at the second-main surface-4 side with respect to the bottom portion of the first body region 41, the bottom portion of the second body region 51, and a bottom portion of the well region 61.

A depth of the deep well region 66 may be not less than 5.0 μm and not more than 15 μm. The depth of the deep well region 66 may be not less than 5.0 μm and not more than 7.0 μm, not less than 7.0 μm and not more than 9.0 μm, not less than 9.0 μm and not more than 11 μm, not less than 11 μm and not more than 13 μm, or not less than 13 μm and not more than 15 μm. The depth of the well region 61 is preferably not less than 5.0 μm and not more than 10 μm.

The p-type impurity concentration of the deep well region 66 is larger than the p-type impurity concentration of the first body region 41, the p-type impurity concentration of the second body region 51, and the p-type impurity concentration of the well region 61. The p-type impurity concentration of the deep well region 66 may be not less than $1.0 \times 10^{16}$ cm$^{-3}$ and not more than $1.0 \times 10^{18}$ cm$^{-3}$.

Referring to FIG. 4 to FIG. 7, the aforementioned main surface insulation layer 21 is formed on the first main surface 3. The main surface insulation layer 21 is continuous with the first gate insulation layer 44, with the second gate insulation layer 54, and with the dummy gate insulation layer 64 in the first main surface 3. The main surface insulation layer 21, the first gate insulation layer 44, the second gate insulation layer 54, and the dummy gate insulation layer 64 may be formed by a single insulation layer formed through the same process step.

The aforementioned interlayer insulation layer 31 is formed on the main surface insulation layer 21. The interlayer insulation layer 31 collectively covers the plurality of first trench gate structures 42 at the active region 11. The interlayer insulation layer 31 collectively covers the plurality of second trench gate structures 52 at the current detection region 12. The interlayer insulation layer 31 covers the well region 61 at the boundary region 13. The interlayer insulation layer 31 collectively covers the plurality of dummy trench gate structures 62 at the boundary region 13. Hence, the dummy gate electrode layer of each of the dummy trench gate structures 62 is electrically insulated from other regions by the dummy gate insulation layer 64 and the interlayer insulation layer 31.

The interlayer insulation layer 31 includes a thin film portion 69 and a thick film portion 70 as an example of a voltage withstanding reinforcement structure. The thick film portion 70 has a thickness that exceeds a thickness of the thin film portion 69. The thin film portion 69 is formed at a portion that covers regions outside the current detection region 12 in the interlayer insulation layer 31. The thick film portion 70 is formed at a portion that covers the current detection region 12 in the interlayer insulation layer 31.

The thick film portion 70 covers the well region 61 in plan view. The thick film portion 70 collectively covers the plurality of dummy trench gate structures 62 in plan view in the present preferred embodiment. The thick film portion 70 is formed in a region between the emitter terminal 33 and the current detection terminal 34.

The thick film portion 70 is formed in a belt shape extending along a direction that intersects a mutually-facing direction in which the emitter terminal 33 and the current detection terminal 34 face each other. The direction that intersects the mutually-facing direction is a direction (i.e., second direction Y) orthogonal to the mutually-facing direction in the present preferred embodiment. An upper end portion of the thick film portion 70 is positioned on the first-main surface-3 side of the semiconductor layer 2 with respect to an upper end portion of the emitter terminal 33 and an upper end portion of the current detection terminal 34.

A thickness TA of the thin film portion 69 may be not less than 0.05 μm and not more than 2 μm. A thickness TA may be not less than 0.05 μm and not more than 0.1 μm, not less than 0.1 μm and not more than 0.5 μm, not less than 0.5 μm and not more than 1.0 μm, not less than 1.0 μm and not more than 1.5 μm, or not less than 1.5 μm and not more than 2.0 μm.

A ratio TB/TA of a thickness TB of the thick film portion 70 with respect to the thickness TA of the thin film portion 69 may be more than 1 and not more than 10. The ratio TB/TA may be more than 1 and not more than 2, not less than 2 and not more than 3, not less than 3 and not more than 4, not less than 4 and not more than 5, not less than 5 and not more than 6, not less than 6 and not more than 7, not less than 7 and not more than 8, not less than 8 and not more than 9, or not less than 9 and not more than 10.

The thickness TB of the thick film portion 70 may be not less than 0.1 μm and not more than 4 μm. The thickness TA may be not less than 0.1 μm and not more than 0.5 μm, not less than 0.5 μm and not more than 1.0 μm, not less than 1.0 μm and not more than 1.5 μm, or not less than 1.5 μm and not more than 2.0 μm.

The interlayer insulation layer 31, more specifically, has a layered structure including a first insulation layer 71 and a second insulation layer 72 that are stacked together in that order from the first-main surface-3 side (main surface-insulation-layer-21 side). The thin film portion 69 of the interlayer insulation layer 31 has a single-layer structure including the first insulation layer 71. The thick film portion 70 of the interlayer insulation layer 31 has a layered structure including the first insulation layer 71 and the second insulation layer 72.

The first insulation layer 71 collectively covers the plurality of first trench gate structures 42, the plurality of second trench gate structures 52, and the plurality of dummy trench gate structures 62. The first insulation layer 71 may have a single-layer structure consisting of a single insulation layer. The first insulation layer 71 may have a layered structure in which a plurality of insulation layers are stacked. The first insulation layer 71 may include a silicon oxide layer, a silicon nitride layer, an aluminum oxide layer, a zirconium oxide layer, or a tantalum oxide layer, or may include at least one material of the other insulating materials. The first insulation layer 71 has a single-layer structure consisting of a silicon oxide layer in the present preferred embodiment.

A thickness TI1 of the first insulation layer 71 may be not less than 0.05 µm and not more than 2 µm. The thickness TI1 may be not less than 0.05 µm and not more than 0.1 µm, not less than 0.1 µm and not more than 0.5 µm, not less than 0.5 µm and not more than 1.0 µm, not less than 1.0 µm and not more than 1.5 µm, or not less than 1.5 µm and not more than 2.0 µm.

The second insulation layer 72 is formed on a portion that covers the current detection region 12 in the first insulation layer 71. The second insulation layer 72 faces the well region 61 with the first insulation layer 71 between the second insulation layer 72 and the well region 61. The second insulation layer 72 collectively faces the plurality of dummy trench gate structures 62 with the first insulation layer 71 between the second insulation layer 72 and the dummy trench gate structures 62.

The second insulation layer 72 is formed in a region between the emitter terminal 33 and the current detection terminal 34 on the first insulation layer 71. An upper end portion of the second insulation layer 72 is positioned on the first-main surface-3 side of the semiconductor layer 2 with respect to the upper end portion of the emitter terminal 33 and the upper end portion of the current detection terminal 34. The second insulation layer 72 may have a single-layer structure consisting of a single insulation layer. The second insulation layer 72 may have a layered structure in which a plurality of insulation layers are stacked together. The second insulation layer 72 may include a silicon oxide layer, a silicon nitride layer, an aluminum oxide layer, a zirconium oxide layer, or a tantalum oxide layer, or may include at least one material of the other insulating materials. The second insulation layer 72 has a single-layer structure consisting of a silicon oxide layer in the present preferred embodiment.

A thickness T12 of the second insulation layer 72 may be not less than 0.05 µm and not more than 2 µm. The thickness T12 may be not less than 0.05 µm and not more than 0.1 µm, not less than 0.1 µm and not more than 0.5 µm, not less than 0.5 µm and not more than 1.0 µm, not less than 1.0 µm and not more than 1.5 µm, or not less than 1.5 µm and not more than 2.0 µm. The thickness TB of the thick film portion 70 of the interlayer insulation layer 31 is adjustable by the thickness of the second insulation layer 72.

A gate opening 73, a first emitter opening 74, a second emitter opening 75, and a well opening 76 are formed in the interlayer insulation layer 31. The gate opening 73 exposes the body portion 23 of the gate wiring 22. The first emitter opening 74 exposes the first emitter region 46 and the first contact region 47 at the active region 11. The second emitter opening 75 exposes the second emitter region 56 and the second contact region 57 at the current detection region 12. The well opening 76 exposes the deep well region 66.

The gate terminal 32, the emitter terminal 33, and the current detection terminal 34 that have been mentioned above are formed on the interlayer insulation layer 31. The gate terminal 32 enters the gate opening 73 from on the interlayer insulation layer 31. The gate terminal 32 is electrically connected to the body portion 23 of the gate wiring 22 in the gate opening 73.

The emitter terminal 33 enters the first emitter opening 74 and the well opening 76 from on the interlayer insulation layer 31. The emitter terminal 33 is electrically connected to the first emitter region 46, the first contact region 47, and the deep well region 66 in the first emitter opening 74.

The current detection terminal 34 (specifically, the second portion 34b of the current detection terminal 34) enters the second emitter opening 75 from on the interlayer insulation layer 31. The current detection terminal 34 is electrically connected to the second emitter region 56 and the second contact region 57 in the second emitter opening 75.

A thickness TE of the gate terminal 32, the emitter terminal 33, and the current detection terminal 34 is larger than the thickness TB of the thick film portion 70. The thickness TE preferably exceeds the thickness TB. In other words, the thickness TB of the thick film portion 70 is preferably less than the thickness TE.

The thickness TE may be not less than 0.5 µm and not more than 4 µm. The thickness TE may be not less than 0.5 µm and not more than 1 µm, not less than 1 µm and not more than 1.5 µm, not less than 1.5 µm and not more than 2 µm, not less than 2 µm and not more than 2.5 µm, not less than 2.5 µm and not more than 3 µm, not less than 3 µm and not more than 3.5 µm, or not less than 3.5 µm and not more than 4 µm.

The aforementioned resin layer 35 is formed on the interlayer insulation layer 31. The resin layer 35 covers the thick film portion 70 of the interlayer insulation layer 31 in a region between the emitter terminal 33 and the current detection terminal 34.

Figure 8:
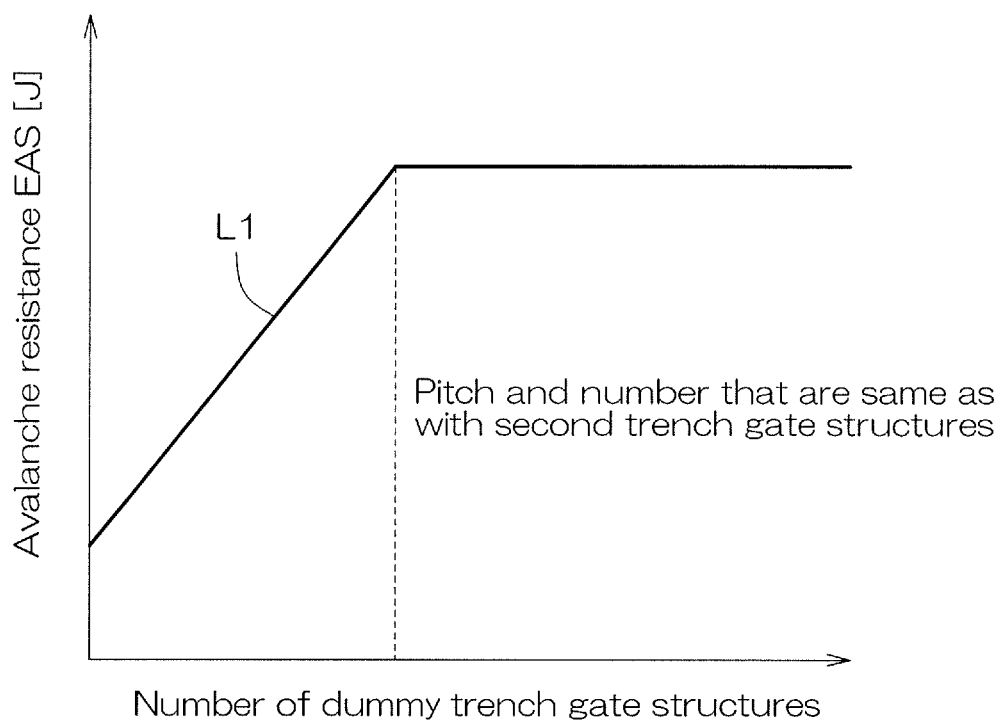
FIG. 8 is a graph showing a result obtained by examining a relationship between a dummy trench gate structure and avalanche resistance by simulation.

FIG. 8 is a graph showing a result obtained by examining a relationship between the dummy trench gate structure 62 and avalanche resistance by simulation. In FIG. 8, the ordinate axis represents avalanche resistance [J], and the abscissa axis represents the number of the dummy trench gate structures 62.

A polygonal line L1 is shown in FIG. 8. The polygonal line L1 represents characteristics of avalanche resistance when the number of the dummy trench gate structures 62 is increased. Referring to the polygonal line L1, the avalanche resistance monotonously increased, and was then saturated when the number of the dummy trench gate structures 62 was increased.

The saturation point of the avalanche resistance appeared when the number of the dummy trench gate structures 62 became equal to the number of the second trench gate structures 52 and when the third pitch P3 of the dummy trench gate structures 62 became equal to the second pitch P2 of the second trench gate structures 52.

It has been understood from the polygonal line L1 that it is possible to improve the avalanche resistance by forming the dummy trench gate structure 62 at the boundary region 13. The reason is that the electric-field concentration with respect to the well region 61 was relaxed, and the dielectric resistance at the boundary region 13 was improved by introducing the dummy trench gate structure 62.

Figure 9:
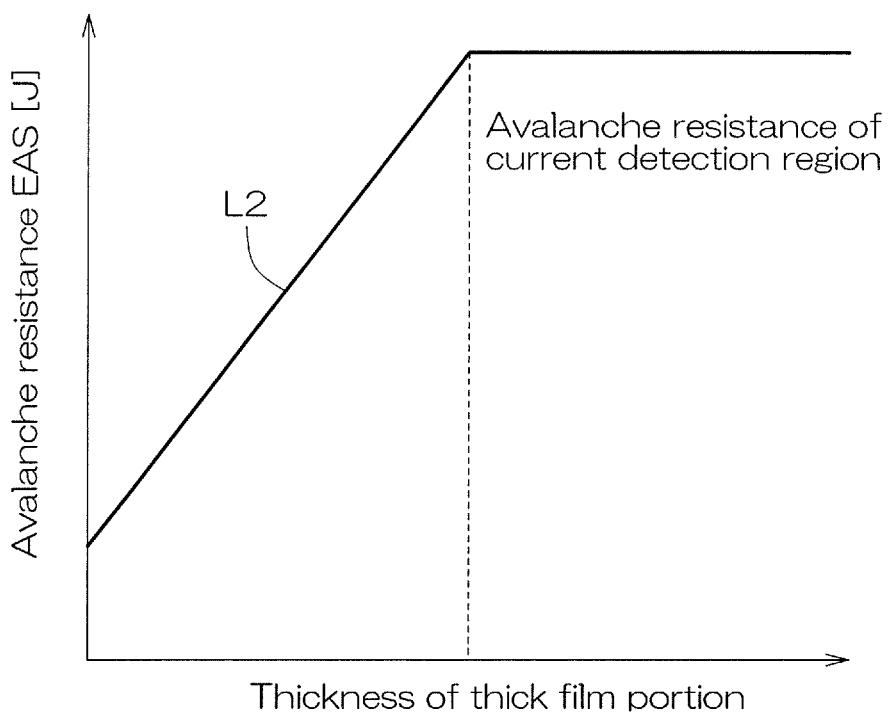
FIG. 9 is a graph showing a result obtained by examining a relationship between the thickness of a thick film portion and avalanche resistance by simulation.

FIG. 9 is a graph showing a result obtained by examining a relationship between the thickness TB of the thick film portion 70 and avalanche resistance by simulation. In FIG. 9, the ordinate axis represents avalanche resistance [J], and the abscissa axis represents the thickness TB of the thick film portion 70.

A polygonal line L2 is shown in FIG. 9. The polygonal line L2 represents characteristics of avalanche resistance when the thickness TB of the thick film portion 70 is increased. Referring to the polygonal line L2, the avalanche resistance monotonously increased, and was then saturated when the thickness TB of the thick film portion 70 was increased. The saturation point of the avalanche resistance was substantially equal to the avalanche resistance of the current detection region 12.

It has been understood from the polygonal line L2 that it is possible to improve the avalanche resistance by forming the thick film portion 70 at the boundary region 13. The reason is that a dielectric breakdown resistance at the boundary region 13 was improved by introducing the thick film portion 70.

However, from a structural viewpoint, it is not preferable for the thickness TB of the thick film portion 70 to exceed the thickness TE of the gate terminal 32, the emitter terminal 33, and the current detection terminal 34. Therefore, it is preferable to adjust the thickness TB of the thick film portion 70 within a range of less than the thickness TE of the gate terminal 32, the emitter terminal 33, and the current detection terminal 34 such as to improve the avalanche resistance.

Figure 10:
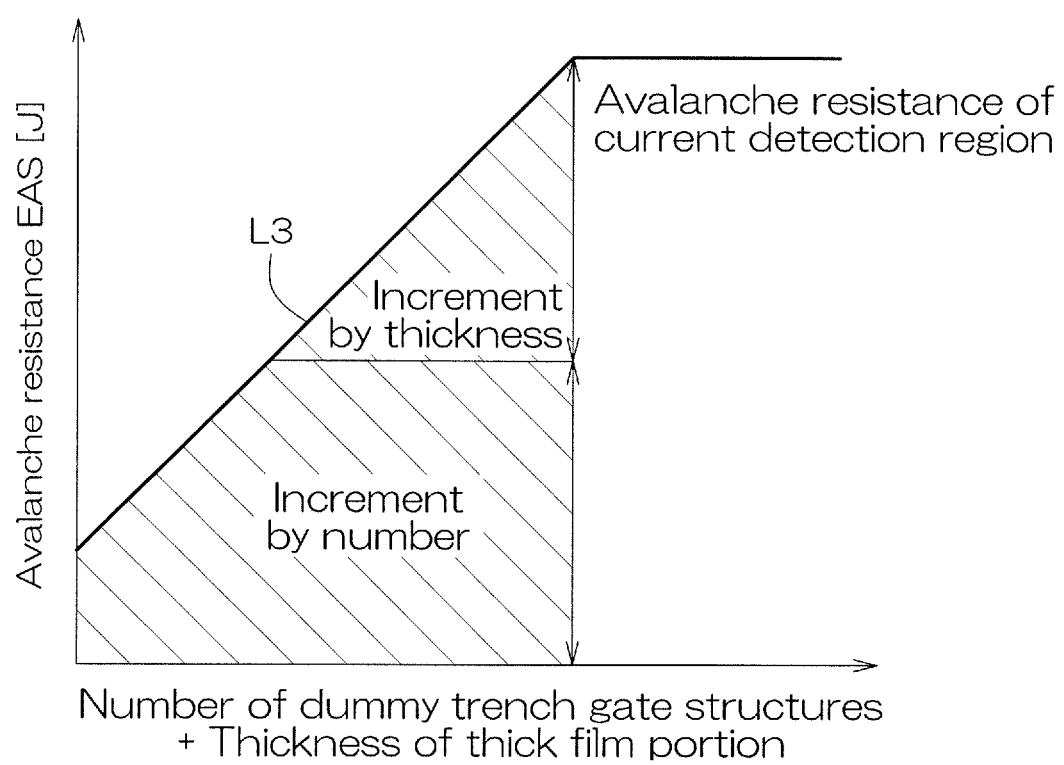
FIG. 10 is a graph showing a result obtained by examining a relationship between a structure having both a dummy trench gate structure and a thick film portion and avalanche resistance by simulation.

FIG. 10 is a graph showing a result obtained by examining a relationship between a structure having the dummy trench gate structure 62 and the thick film portion 70 and avalanche resistance by simulation. In FIG. 10, the ordinate axis represents avalanche resistance [J], and the abscissa axis represents a combination of the number of the dummy trench gate structures 62 and the thickness TB of the thick film portion 70.

A polygonal line L3 is shown in FIG. 10. The polygonal line L3 represents characteristics of avalanche resistance when the number of the dummy trench gate structures 62 and the thickness TB of the thick film portion are adjusted on the basis of results of the aforementioned polygonal lines L1 (see FIG. 8) and L2 (see FIG. 9).

Referring to the polygonal line L3, it has been understood that it is possible to improve the avalanche resistance while restraining an increase in thickness of the thick film portion 70 by adjusting the number of the dummy trench gate structures 62 and the thickness TB of the thick film portion 70. The avalanche resistance monotonously increased, and was then saturated. The saturation point of the avalanche resistance was substantially equal to the avalanche resistance of the current detection region 12.

As described above, according to the semiconductor device 1, it is possible to restrain a decrease in withstand voltage that originates from the boundary region 13 between the active region 11 and the current detection region 12.

Figure 11:
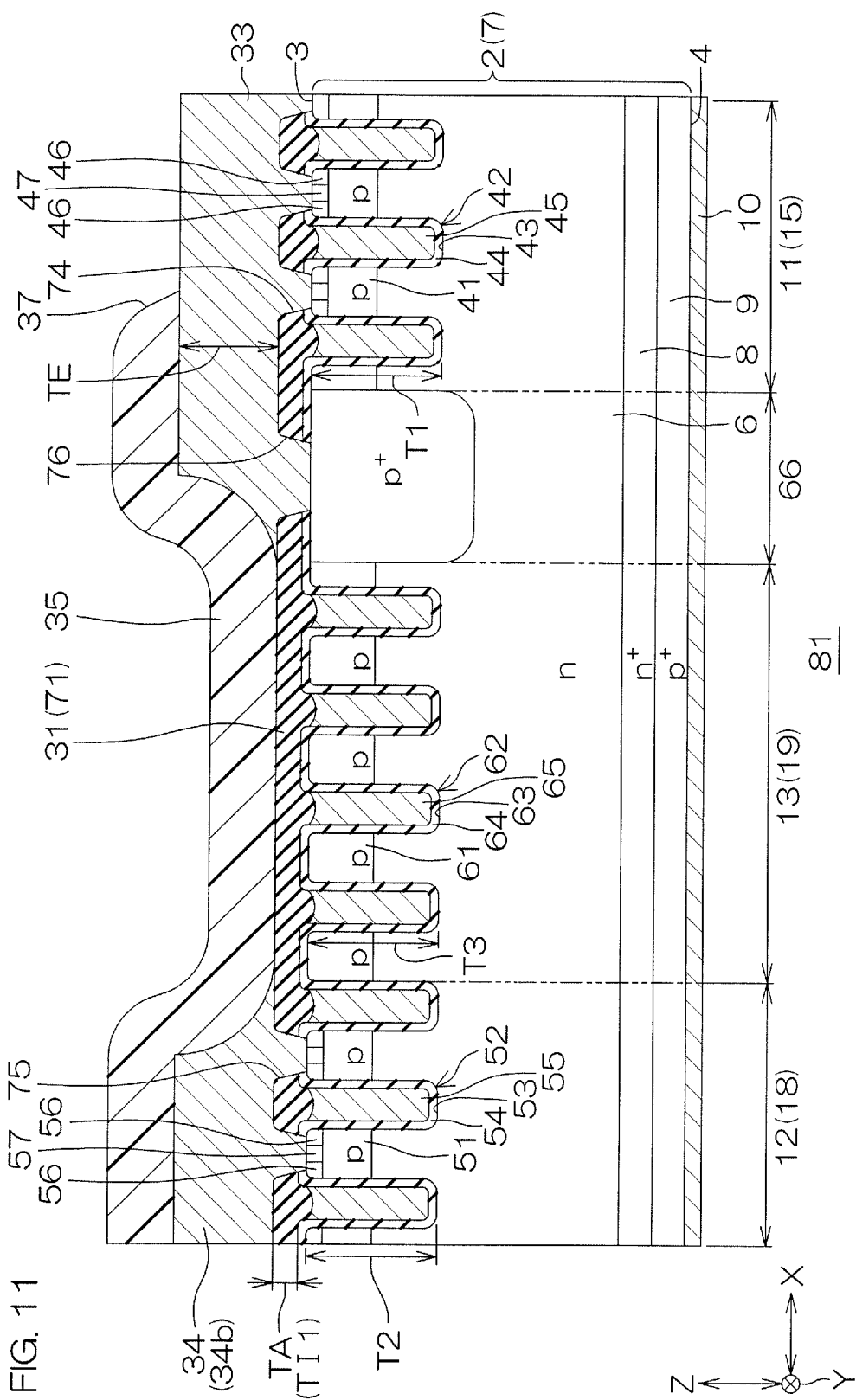
FIG. 11 is a cross-sectional view of a part corresponding to FIG. 7, showing a semiconductor device according to a second preferred embodiment of the present invention.

FIG. 11 is a cross-sectional view of a part corresponding to FIG. 7, showing a semiconductor device 81 according to a second preferred embodiment of the present invention. Hereinafter, the same reference sign is given to a structure corresponding to each structure mentioned in the semiconductor device 1, and a description of the structure is omitted.

Referring to FIG. 11, the semiconductor device 81 does not have the thick film portion 70 unlike the semiconductor device 1. As described in FIG. 8 to FIG. 10, it is possible to improve the avalanche resistance even if only the dummy trench gate structures 62 are provided. Therefore, according to the semiconductor device 81, it is possible to restrain a decrease in withstand voltage that originates from the boundary region 13 between the active region 11 and the current detection region 12.

Figure 12:
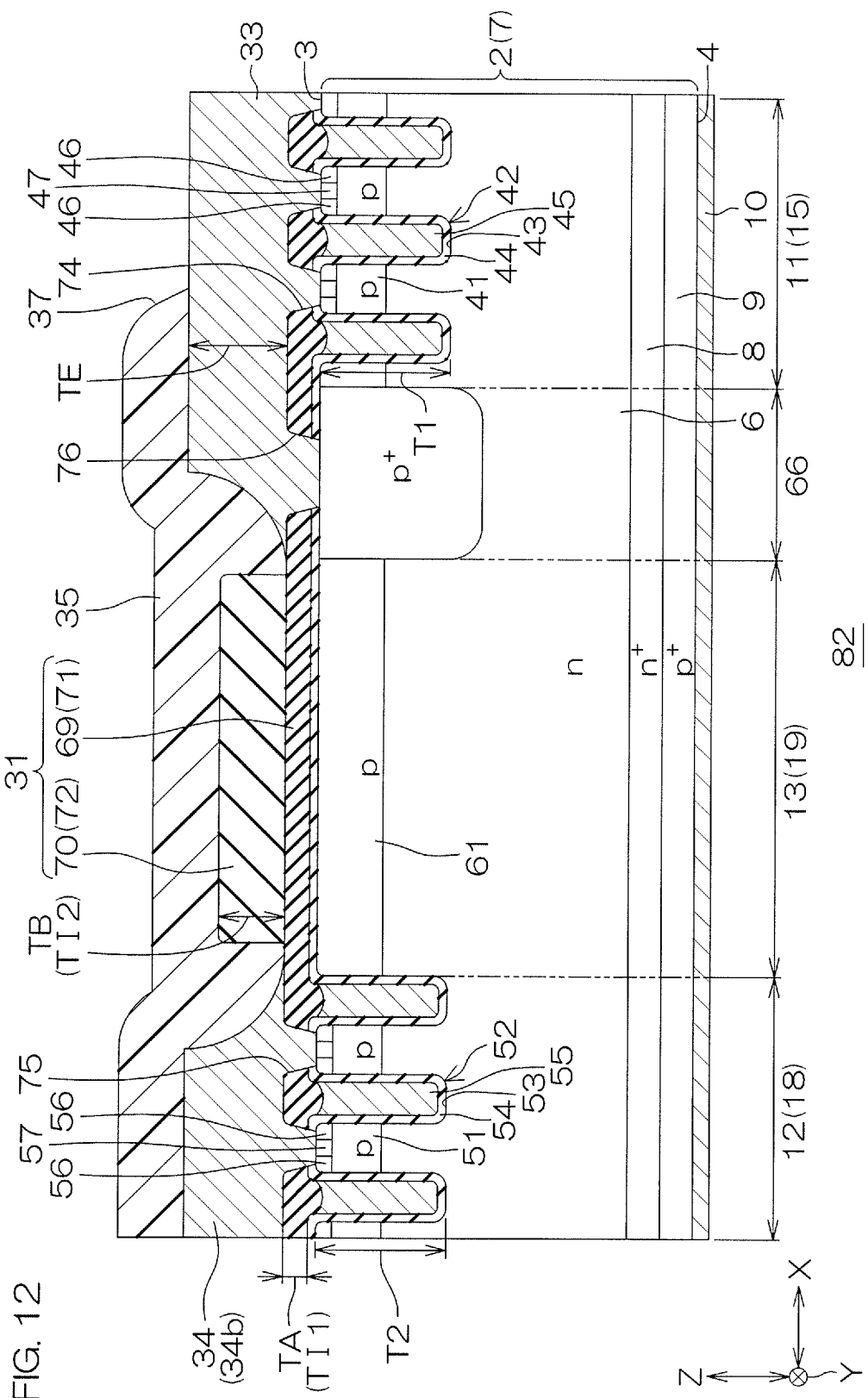
FIG. 12 is a cross-sectional view of a part corresponding to FIG. 7, showing a semiconductor device according to a third preferred embodiment of the present invention.

FIG. 12 is a cross-sectional view of a part corresponding to FIG. 7, showing a semiconductor device 82 according to a third preferred embodiment of the present invention. Hereinafter, the same reference sign is given to a structure corresponding to each structure mentioned in the semiconductor device 1, and a description of the structure is omitted.

Referring to FIG. 12, the semiconductor device 82 does not have the dummy trench gate structures 62 unlike the semiconductor device 1. As described in FIG. 8 to FIG. 10, it is possible to improve the avalanche resistance even if only the thick film portion 70 is provided. Therefore, according to the semiconductor device 82, it is possible to restrain a decrease in withstand voltage that originates from the boundary region 13 between the active region 11 and the current detection region 12.

Figure 13:
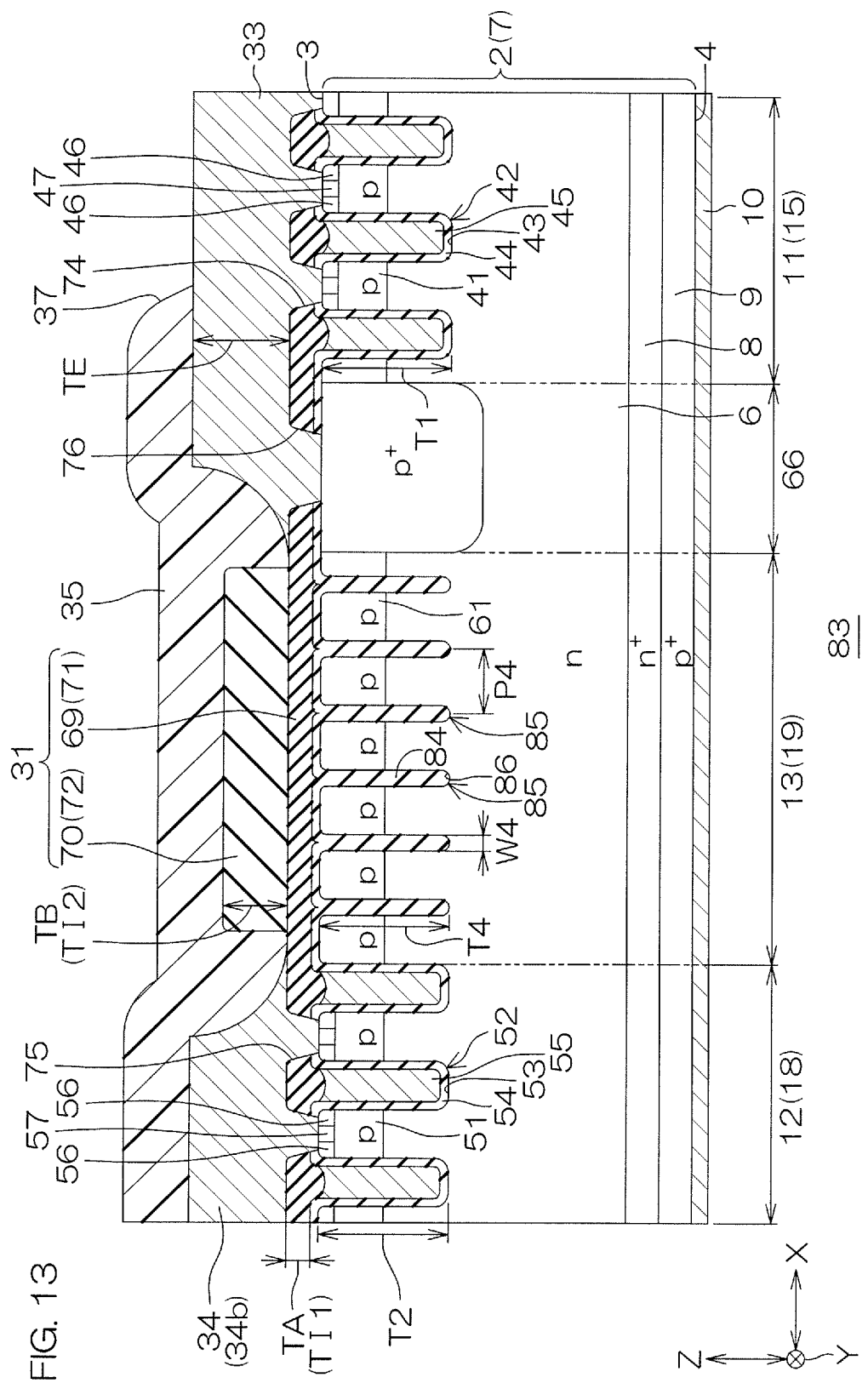
FIG. 13 is a cross-sectional view of a part corresponding to FIG. 7, showing a semiconductor device according to a fourth preferred embodiment of the present invention.

FIG. 13 is a cross-sectional view of a part corresponding to FIG. 7, showing a semiconductor device 83 according to a fourth preferred embodiment of the present invention. Hereinafter, the same reference sign is given to a structure corresponding to each structure mentioned in the semiconductor device 1, and a description of the structure is omitted.

Referring to FIG. 13, the semiconductor device includes a single or a plurality of (in the present preferred embodiment, six) insulators 84, which is or are used as an example of the electric field relaxation structure 19, embedded in the first main surface 3 of the semiconductor layer 2 at the boundary region 13, instead of the dummy trench gate structure 62. The number of the insulators 84 is adjusted in accordance with the width WW of the well region 61.

In detail, the semiconductor device 83 includes a single or a plurality of (in the present preferred embodiment, six) trench insulation structures 85 formed in the first main surface 3 of the semiconductor layer 2. Each of the trench insulation structures 85 includes the insulator 84. The plurality of trench insulation structures 85 are formed with intervals between the trench insulation structures 85 along the first direction X, and are each formed in a belt shape extending along the second direction Y. The plurality of trench insulation structures 85 are formed in a stripe shape extending along the second direction Y as a whole. Each of the trench insulation structures 85 passes through the well region 61. A bottom portion of each of the trench insulation structures 85 is positioned inside the drift region 6.

Regarding to the normal direction Z, a fourth thickness T4 of each of the trench insulation structures 85 may be not less than 1 μm and not more than 10 μm. The fourth thickness T4 may be not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

The fourth thickness T4 is preferably not less than 2 μm and not more than 6 μm. The fourth thickness T4 is preferably equal to the second thickness T2 of the second trench gate structure 52. The fourth thickness T4 is preferably equal to the first thickness T1 of the first trench gate structure 42.

Regarding to the first direction X, the fourth width W4 of each of the trench insulation structures 85 is less than the second width W2 of the second trench gate structure 52. The fourth width W4 may be not less than 0.1 μm and not more than 1.5 μm. The fourth width W4 may be not less than 0.1 μm and not more than 0.3 μm, not less than 0.3 μm and not more than 0.6 μm, not less than 0.6 μm and not more than 0.9 μm, not less than 0.9 μm and not more than 1.2 μm, or not less than 1.2 μm and not more than 1.5 μm.

Regarding to the first direction X, a fourth pitch P4 of the plurality of trench insulation structures 85 may be not less than 0.5 μm and not more than 10 μm. The fourth pitch P4 is a distance between central portions of two trench insulation structures 85 that adjoin each other. The fourth pitch P4 may be not less than 0.5 μm and not more than 1 μm, not less than 1 μm and not more than 2 μm, not less than 2 μm and not more than 4 μm, not less than 4 μm and not more than 6 μm, not less than 6 μm and not more than 8 μm, or not less than 8 μm and not more than 10 μm.

Each of the trench insulation structures 85, more specifically, includes an insulation trench 86 and the insulator 84. The insulation trench 86 is formed by digging down the first main surface 3 toward the second main surface 4. The insulation trench 86 passes through the well region 61. A bottom portion of the insulation trench 86 is positioned inside the drift region 6.

The insulator 84 is embedded in the insulation trench 86 as an integral piece. The insulator 84 is formed by integrating two insulation layers respectively formed in film shapes along both sidewalls of the insulation trench 86 with each other inside the insulation trench 86. In other words, the insulator 84 has a layered structure in which two insulation layers are stacked together with respect to a direction (i.e., first direction X) orthogonal to a direction along which the trench insulation structure 85 extends. The boundary of the two insulation layers extends along the normal direction Z. The two insulation layers may each have a single-layer structure consisting of a silicon oxide ($SiO_2$) layer or a silicon nitride (SiN) layer.

The two insulation layers may each have a layered structure including a silicon oxide layer and a silicon nitride layer. The silicon oxide layer may be formed on the silicon nitride layer. The silicon nitride layer may be formed on the silicon oxide layer. The two insulation layers each have a single-layer structure consisting of a silicon oxide layer in the present preferred embodiment.

The main surface insulation layer 21, the first gate insulation layer 44, the second gate insulation layer 54, and the insulator 84 may be formed by a single insulation layer formed through the same process step. The thick film portion 70 of the interlayer insulation layer 31 collectively covers the plurality of trench insulation structures 85 in plan view in the present preferred embodiment.

According to the trench insulation structure 85 (insulator 84), it is possible to provide the same effect as that of both the dummy trench gate structures 62 and the thick film portions 70. In other words, according to the trench insulation structure 85 (insulator 84), it is possible to raise dielectric breakdown resistance at the boundary region 13 while relaxing electric-field concentration with respect to the well region 61. Therefore, according to the semiconductor device 83, it is possible to restrain a decrease in withstand voltage that originates from the boundary region 13 between the active region 11 and the current detection region 12.

Figure 14:
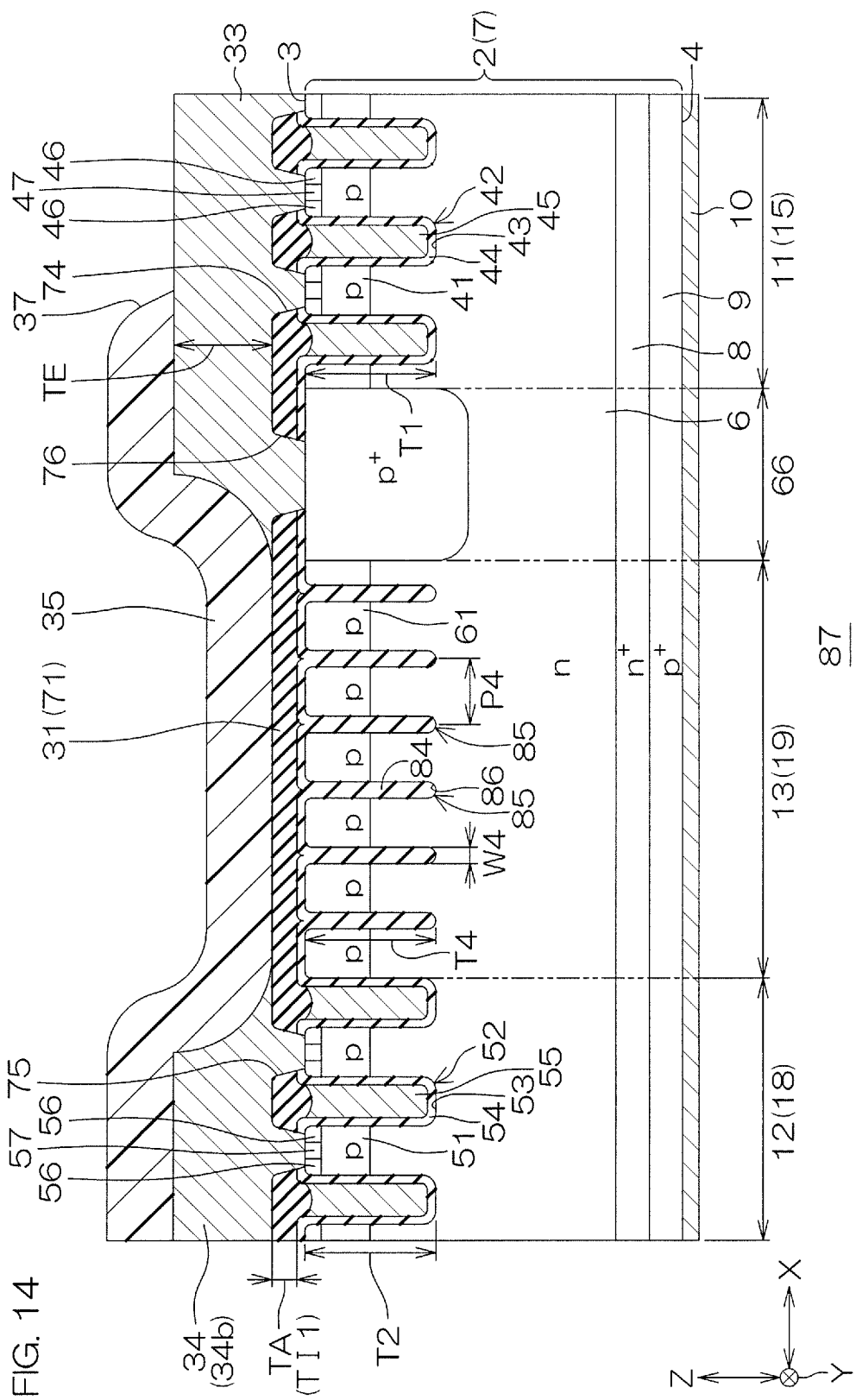
FIG. 14 is a cross-sectional view of a part corresponding to FIG. 7, showing a semiconductor device according to a fifth preferred embodiment of the present invention.

FIG. 14 is a cross-sectional view of a part corresponding to FIG. 7, showing a semiconductor device 87 according to a fifth preferred embodiment of the present invention. Hereinafter, the same reference sign is given to a structure corresponding to each structure mentioned in the semiconductor device 83, and a description of the structure is omitted.

Referring to FIG. 14, the semiconductor device 87 does not have the thick film portion 70 unlike the semiconductor device 83. It is possible to improve the avalanche resistance even if only the trench insulation structure 85 (insulator 84) is provided. Therefore, according to the semiconductor device 87, it is possible to restrain a decrease in withstand voltage that originates from the boundary region 13 between the active region 11 and the current detection region 12.

Figure 15:
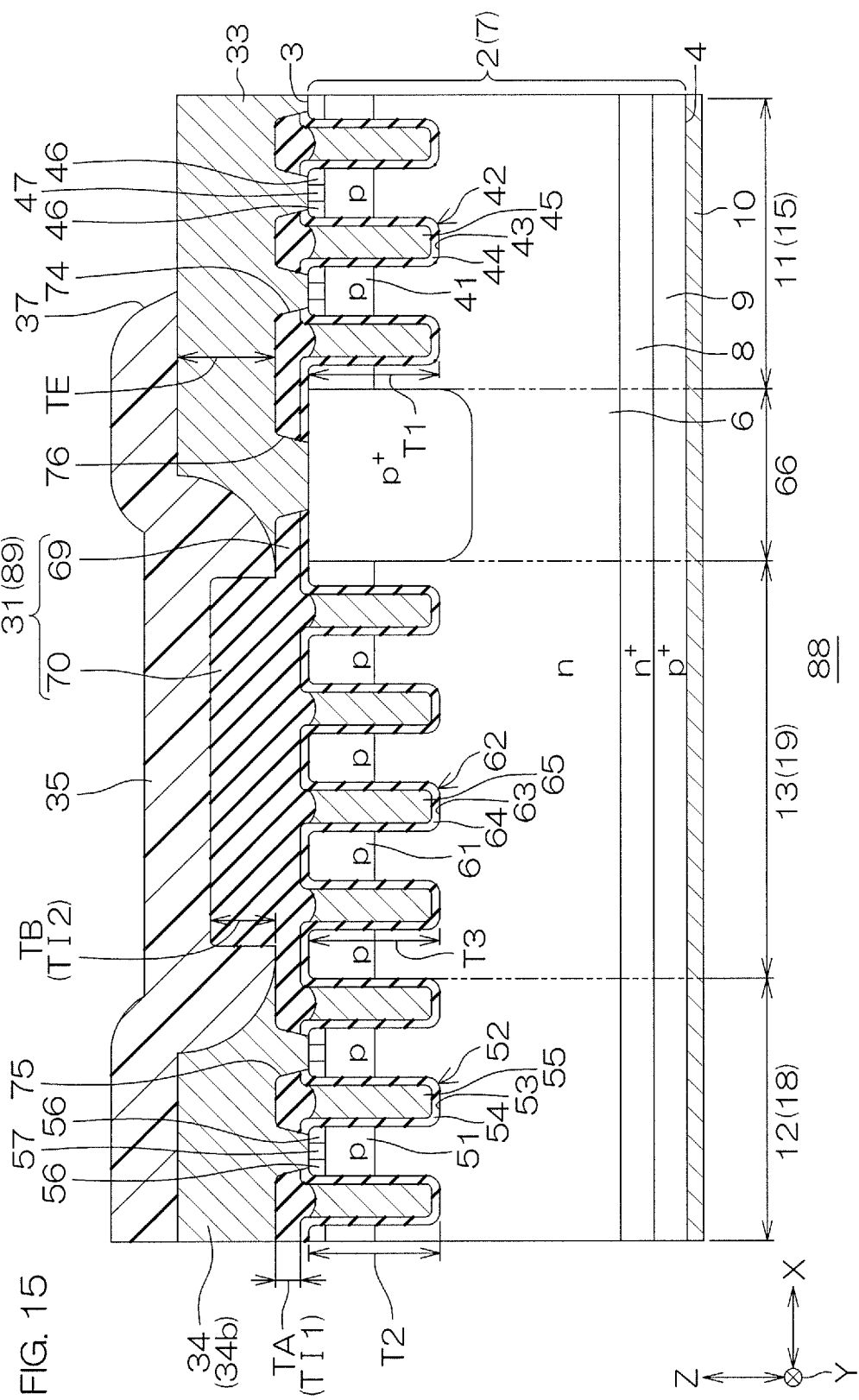
FIG. 15 is a cross-sectional view of a part corresponding to FIG. 7, showing a semiconductor device according to a sixth preferred embodiment of the present invention.

FIG. 15 is a cross-sectional view of a part corresponding to FIG. 7, showing a semiconductor device 88 according to a sixth preferred embodiment of the present invention. Hereinafter, the same reference sign is given to a structure corresponding to each structure mentioned in the semiconductor device 1, and a description of the structure is omitted.

Referring to FIG. 15, the interlayer insulation layer 31 according to the semiconductor device 88 does not have a layered structure including the first insulation layer 71 and the second insulation layer 72 unlike the interlayer insulation layer 31 according to the semiconductor device 1. The interlayer insulation layer 31 has a single-layer structure consisting of a single insulation layer 89.

The thin film portion 69 and the thick film portion 70 of the interlayer insulation layer 31 are formed by processing the single insulation layer 89. In detail, the thin film portion 69 and the thick film portion 70 are formed by partially removing the single insulation layer 89 according to an etching method through a mask.

As described above, according to the semiconductor device 88, it is possible to restrain a decrease in withstand voltage that originates from the boundary region 13 between the active region 11 and the current detection region 12. A structure in which the interlayer insulation layer 31 consists of the single insulation layer 89 is applicable also to the aforementioned third and fourth preferred embodiments in addition to the first preferred embodiment.

Figure 16:
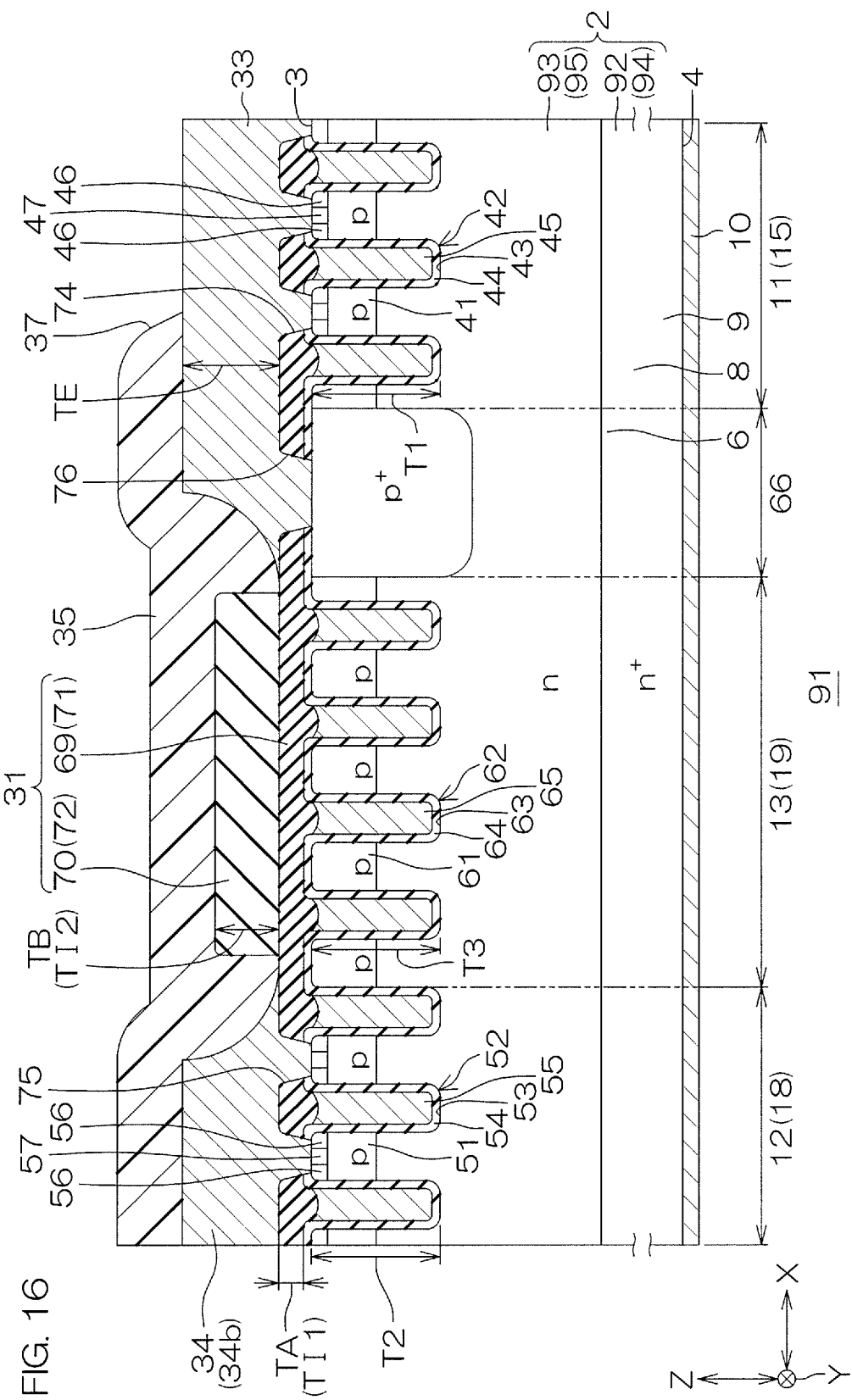
FIG. 16 is a cross-sectional view of a part corresponding to FIG. 7, showing a semiconductor device according to a seventh preferred embodiment of the present invention.

FIG. 16 is a cross-sectional view of a part corresponding to FIG. 7, showing a semiconductor device 91 according to a seventh preferred embodiment of the present invention. Hereinafter, the same reference sign is given to a structure corresponding to each structure mentioned in the semiconductor device 1, and a description of the structure is omitted.

Referring to FIG. 16, the semiconductor device 91 is an electronic component provided with a MISFET (Metal Insulator Field Effect Transistor), which is an example of an insulated-gate type transistor, instead of the IGBT in the present preferred embodiment.

The semiconductor layer 2 has a layered structure including an semiconductor substrate 92 of $n^+$-type and an epitaxial layer 93 of n-type in the present preferred embodiment. The semiconductor substrate 92 and the epitaxial layer 93 each include silicon. The second main surface 4 of the semiconductor layer 2 is formed by the semiconductor substrate 92. The first main surface 3 of the semiconductor layer 2 is formed by the epitaxial layer 93. The lateral surfaces 5A to 5D of the semiconductor layer 2 are formed by the semiconductor substrate 92 and the epitaxial layer 93.

The n-type impurity concentration of the epitaxial layer 93 is equal to or less than the n-type impurity concentration of the semiconductor substrate 92. In detail, the n-type impurity concentration of the epitaxial layer 93 is less than the n-type impurity concentration of the semiconductor substrate 92. The n-type impurity concentration of the semiconductor substrate 92 may be not less than $1.0 \times 10^{18}$ $cm^{-3}$ and not more than $1.0 \times 10^{21}$ $cm^{-3}$. The n-type impurity concentration of the epitaxial layer 93 may be not less than $1.0 \times 10^{15}$ $cm^{-3}$ and not more than $1.0 \times 10^{18}$ $cm^{-3}$.

The semiconductor substrate 92 is formed as a drain region 94 of the MISFET. The epitaxial layer 93 is formed as a drift region 95 of the MISFET.

The active region 11, the current detection region 12, and the boundary region 13 are each formed at the epitaxial layer 93. The other structures are the same as those of the semiconductor device 1. The description of the semiconductor device 1 is applied to a description of the semiconductor device 91 by reading the "emitter" of the IGBT as the "source" of the MISFET and by reading the "collector" of the IGBT as the "drain" of the MISFET.

As described above, according to the semiconductor device 91, it is likewise possible to restrain a decrease in withstand voltage that originates from the boundary region 13 between the active region 11 and the current detection region 12. A structure in which the semiconductor layer 2 has a layered structure including the $n^+$-type semiconductor substrate 92 and the n-type epitaxial layer 93 is applicable also to the aforementioned second to sixth preferred embodiments in addition to the first preferred embodiment.

Preferred embodiments of the present invention can be carried out in still other modes.

The semiconductor layer 2 has a single-layer structure consisting of the semiconductor substrate 7 as described as an example in the aforementioned first to sixth preferred embodiments. However, the semiconductor layer 2 may have a layered structure having a p$^+$-type semiconductor substrate and an n-type epitaxial layer. In this case, the p$^+$-type semiconductor substrate becomes the collector region 9, and the n-type epitaxial layer becomes the drift region 6.

In each of the aforementioned preferred embodiments, a structure in which the conductivity type in each semiconductor portion is reversed may be employed. In other words, the p-type portion may be inverted into an n-type, and the n-type portion may be inverted into a p-type.

This description does not limit any combined configuration of the features shown in the first to seventh preferred embodiments. The first to seventh preferred embodiments can be combined together in an arbitrary aspect and in an arbitrary mode among those embodiments. In other words, a semiconductor device in which the features shown in the first to seventh preferred embodiments are combined together in an arbitrary aspect and in an arbitrary mode may be employed.

Examples of features extracted from the description and the drawings will be hereinafter shown.

[A1] A semiconductor device comprising: a semiconductor layer of first-conductivity-type that has a main surface and that includes an active region set at the main surface a current detection region set at the main surface away from the active region and a boundary region set in a region between the active region and the current detection region at the main surface; a first body region of second-conductivity-type formed in a surface layer portion of the main surface at the active region; a first trench gate structure formed in the main surface at the active region; a second body region of second-conductivity-type formed in the surface layer portion of the main surface at the current detection region; a second trench gate structure formed in the main surface at the current detection region; a well region of second-conductivity-type formed in the surface layer portion of the main surface at the boundary region; and an insulator embedded in the surface layer portion of the main surface at the boundary region.

[A2] A semiconductor device comprising: a semiconductor layer of first-conductivity-type that has a main surface and that includes an active region set at the main surface, a current detection region set at the main surface away from the active region and a boundary region set in a region between the active region and the current detection region at the main surface; a first body region of second-conductivity-type formed in a surface layer portion of the main surface at the active region; a first trench gate structure formed in the main surface at the active region; a second body region of second-conductivity-type formed in the surface layer portion of the main surface at the current detection region; a second trench gate structure formed in the main surface at the current detection region; a well region of second-conductivity-type formed in the surface layer portion of the main surface at the boundary region; and an insulation layer that selectively covers the active region, the current detection region and the boundary region on the main surface and that has a thick film portion facing the well region at a portion covering the boundary region.

[A3] The semiconductor device according to A1 or A2, further comprising: a deep well region of second-conductivity-type that is formed in a region between the first body region and the well region in the surface layer portion of the main surface and that is deeper than the first body region and the well region.

[A4] The semiconductor device according to A3, wherein the deep well region surrounds the active region.

[A5] The semiconductor device according to any one of A1 to A4, further comprising: a current detection terminal formed on the main surface, wherein the second body region is electrically connected to the current detection terminal.

[A6] The semiconductor device according to A5, wherein the current detection terminal covers the current detection region, and the second body region is electrically connected to the current detection terminal in a region directly below the current detection terminal.

[A7] The semiconductor device according to any one of A1 to A6, further comprising: a gate terminal formed on the main surface, wherein the first trench gate structure and the second trench gate structure are electrically connected to the gate terminal.

[A8] The semiconductor device according to A7, wherein the gate terminal is formed such as to avoid the active region, the current detection region, and the boundary region in plan view.

[A9] The semiconductor device according to A7 or A8, further comprising: a gate wiring that is selectively drawn around on the main surface and that is electrically connected to the gate terminal, wherein the first trench gate structure and the second trench gate structure are electrically connected to the gate terminal through the gate wiring.

[A10] The semiconductor device according to any one of A1 to A9, further comprising: a reference voltage terminal formed on the main surface, wherein the first body region is electrically connected to the reference voltage terminal.

[A11] The semiconductor device according to A10, wherein the reference voltage terminal covers the active region, and the first body region is electrically connected to the reference voltage terminal in a region directly below the reference voltage terminal.

[A12] The semiconductor device according to any one of A1 to A11, wherein the current detection region has a planar area less than a planar area of the active region.

[A13] The semiconductor device according to any one of A1 to A12, wherein a ratio I2/I1 of a second electric current I2 flowing through the current detection region with respect to a first electric current I1 flowing through the active region is not less than 1/10000 and not more than 1/100.

[A14] The semiconductor device according to any one of A1 to A13, further comprising: a first impurity region of first-conductivity-type formed in a surface layer portion of the first body region at the active region and a second impurity region of first-conductivity-type formed in a surface layer portion of the second body region at the current detection region.

[A15] The semiconductor device according to A14, wherein the first impurity region is a first emitter region, and the second impurity region is a second emitter region.

[A16] The semiconductor device according to A14, wherein the first impurity region is a first source region, and the second impurity region is a second source region.

What is claimed is:
1. A semiconductor device comprising:
a semiconductor layer of a first-conductivity-type that has a main surface and that includes an active region set at the main surface, a current detection region set at the main surface away from the active region, and a boundary region set in a region between the active region and the current detection region at the main surface;

a first body region of a second-conductivity-type formed in a surface layer portion of the main surface at the active region;

a first trench gate structure formed in the main surface at the active region;

a second body region of the second-conductivity-type formed in the surface layer portion of the main surface at the current detection region;

a second trench gate structure formed in the main surface at the current detection region;

a well region of the second-conductivity-type formed in the surface layer portion of the main surface at the boundary region;

a dummy trench gate structure formed in an electrically floating state in the main surface at the boundary region and electrically isolated from at least the first trench gate structure; and an interlayer insulation layer formed on the well region for covering the well region at the boundary region;

wherein the interlayer insulation layer includes a thin film portion and a thick film portion which has a thickness that exceeds a thickness of the thin film portion, and wherein the thick film portion is formed at a portion that covers the current detection region in the interlayer insulation layer.

2. The semiconductor device according to claim 1, further comprising:

a current detection terminal formed on the main surface; wherein the second body region is electrically connected to the current detection terminal.

3. The semiconductor device according to claim 2, wherein the current detection terminal covers the current detection region, and the second body region is electrically connected to the current detection terminal in a region directly below the current detection terminal.

4. The semiconductor device according to claim 1, further comprising:

a gate terminal formed on the main surface; wherein the first trench gate structure and the second trench gate structure are electrically connected to the gate terminal.

5. The semiconductor device according to claim 4, wherein the gate terminal is formed such as to avoid the active region, the current detection region and the boundary region in plan view.

6. The semiconductor device according to claim 4, further comprising:

a gate wiring that is selectively drawn around on the main surface and that is electrically connected to the gate terminal; wherein the first trench gate structure and the second trench gate structure are electrically connected to the gate terminal through the gate wiring.

7. The semiconductor device according to claim 1, further comprising:

a reference voltage terminal formed on the main surface; wherein the first body region is electrically connected to the reference voltage terminal.

8. The semiconductor device according to claim 7, wherein the reference voltage terminal covers the active region, and the first body region is electrically connected to the reference voltage terminal in a region directly below the reference voltage terminal.

9. The semiconductor device according to claim 1, wherein the current detection region has a planar area less than a planar area of the active region.

10. The semiconductor device according to claim 1, wherein a ratio I2/I1 of a second electric current I2 flowing through the current detection region with respect to a first electric current I1 flowing through the active region is not less than 1/10000 and not more than 1/100.

11. The semiconductor device according to claim 1, further comprising:

a first impurity region of the first-conductivity-type formed in a surface layer portion of the first body region at the active region; and a second impurity region of the first-conductivity-type formed in a surface layer portion of the second body region at the current detection region.

12. The semiconductor device according to claim 11, wherein the first impurity region is a first emitter region, and the second impurity region is a second emitter region.

13. The semiconductor device according to claim 11, wherein the first impurity region is a first source region, and the second impurity region is a second source region.

14. A semiconductor device comprising:

a semiconductor layer of a first-conductivity-type that has a main surface and that includes an active region set at the main surface, a current detection region set at the main surface away from the active region, and a boundary region set in a region between the active region and the current detection region at the main surface;

a first body region of a second-conductivity-type formed in a surface layer portion of the main surface at the active region;

a first trench gate structure formed in the main surface at the active region;

a second body region of the second-conductivity-type formed in the surface layer portion of the main surface at the current detection region;

a second trench gate structure formed in the main surface at the current detection region;

a well region of the second-conductivity-type formed in the surface layer portion of the main surface at the boundary region;

an insulator embedded as an integrated member in the surface layer portion of the main surface at the boundary region; and an interlayer insulation layer formed on the well region for covering the well region at the boundary region;

wherein the interlayer insulation layer includes a thin film portion and a thick film portion which has a thickness that exceeds a thickness of the thin film portion, and wherein the thick film portion is formed at a portion that covers the current detection region in the interlayer insulation layer.

* * * * *